(12) United States Patent
Lee et al.

(10) Patent No.: US 9,501,068 B2
(45) Date of Patent: Nov. 22, 2016

(54) INTEGRATION OF PRESSURE SENSORS INTO INTEGRATED CIRCUIT FABRICATION AND PACKAGING

(71) Applicant: INTEL CORPORATION, Santa Clara, CA (US)

(72) Inventors: Kyu Oh Lee, Chandler, AZ (US); Sasha N. Oster, Chandler, AZ (US); Feras Eid, Chandler, AZ (US); Sarah Haney, Cary, NC (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/019,740

(22) Filed: Feb. 9, 2016

(65) Prior Publication Data

US 2016/0161957 A1    Jun. 9, 2016

Related U.S. Application Data

(62) Division of application No. 14/141,875, filed on Dec. 27, 2013, now Pat. No. 9,260,294.

(51) Int. Cl.
| | |
|---|---|
| *G05D 16/20* | (2006.01) |
| *B81C 1/00* | (2006.01) |
| *B81B 7/00* | (2006.01) |
| *B81B 3/00* | (2006.01) |

(52) U.S. Cl.
CPC ......... *G05D 16/2026* (2013.01); *B81B 3/0027* (2013.01); *B81B 7/008* (2013.01); *B81C 1/00158* (2013.01); *B81C 1/00246* (2013.01); *B81C 1/00547* (2013.01); *B81B 7/007* (2013.01); *B81B 2201/025* (2013.01); *B81B 2201/0264* (2013.01); *B81B 2203/0127* (2013.01); *B81B 2207/094* (2013.01); *B81C 1/00238* (2013.01); *B81C 1/00333* (2013.01); *B81C 2201/056* (2013.01); *B81C 2203/0172* (2013.01); *B81C 2203/0714* (2013.01); *B81C 2203/0792* (2013.01)

(58) Field of Classification Search
CPC ....... B81B 7/008; B81B 7/007; B81B 7/094; B81B 7/00238; G01L 9/0042
See application file for complete search history.

(56) References Cited

U.S. PATENT DOCUMENTS

| | | | |
|---|---|---|---|
| 6,992,367 B2 * | 1/2006 | Erratico | B81C 1/00404 257/528 |
| 2007/0052046 A1 | 3/2007 | Chu et al. | |
| 2010/0242592 A1 * | 9/2010 | Haneef | G01F 1/6845 73/204.26 |
| 2014/0358301 A1 | 12/2014 | Muir et al. | |

* cited by examiner

*Primary Examiner* — Mamadou Diallo
(74) *Attorney, Agent, or Firm* — Blakely, Sokoloff, Taylor & Zafman LLP

(57) ABSTRACT

A pressure sensor is integrated into an integrated circuit fabrication and packaging flow. In one example, a releasable layer is formed over a removable core. A first dielectric layer is formed. A metal layer is patterned to form conductive metal paths and to form a diaphragm with the metal. A second dielectric layer is formed over the metal layer and the diaphragm. A second metal layer is formed to connect with formed vias and to form a metal mesh layer over the diaphragm. The first dielectric layer is etched under the diaphragm to form a cavity and the cavity is covered to form a chamber adjoining the diaphragm.

20 Claims, 24 Drawing Sheets

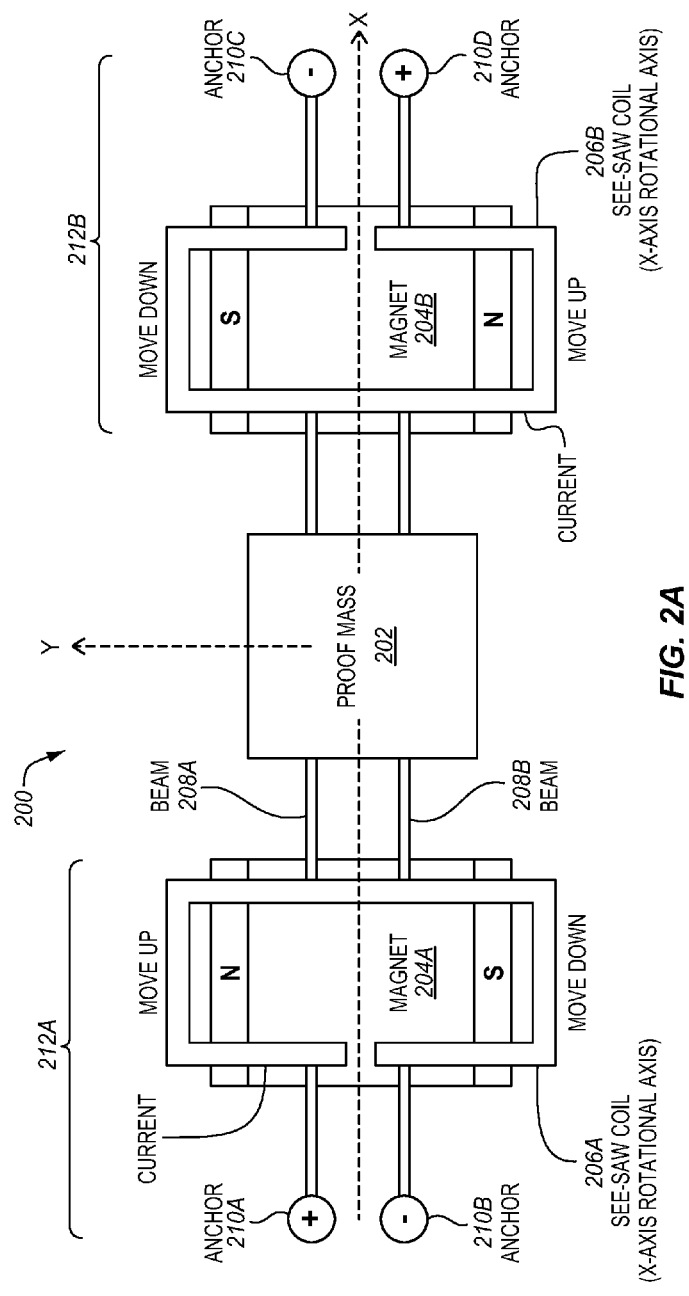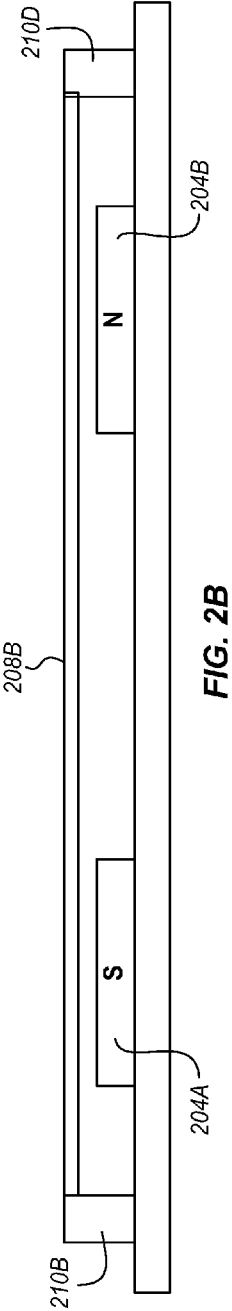

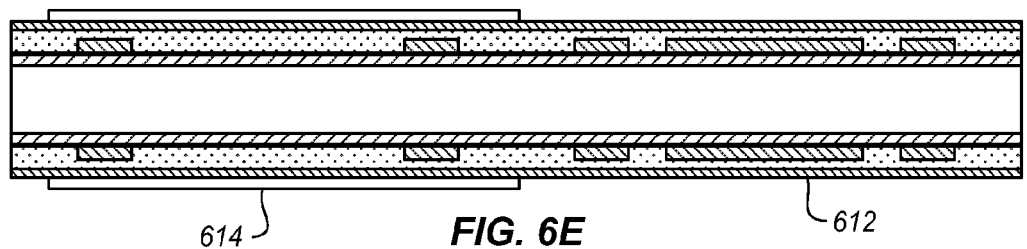
614     *FIG. 6E*     612
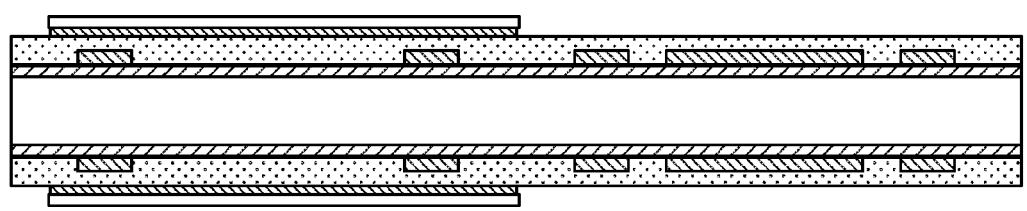
*FIG. 6F*
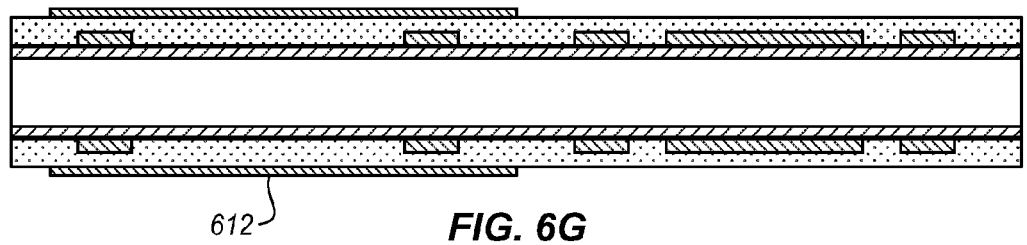
612     *FIG. 6G*
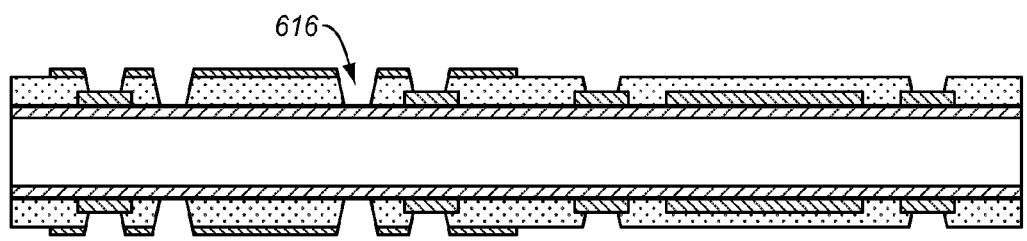
616
*FIG. 6H*

INTEGRATION OF PRESSURE SENSORS INTO INTEGRATED CIRCUIT FABRICATION AND PACKAGING

CROSS-REFERENCE TO RELATED APPLICATIONS

The present application is a division of prior application Ser. No. 14/141,875, filed Dec. 27, 2013, entitled, INTEGRATION OF PRESSURE OR INERTIAL SENSORS INTO INTEGRATED CIRCUIT FABRICATION AND PACKAGING, by Kyu Oh Lee, the priority of which is hereby claimed.

TECHNICAL FIELD

The present description relates to the field of semiconductor packages and, in particular, to integrating the formation or structure of pressure or inertial sensors in the flow of producing semiconductor packages.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables a thin packaging profile and low overall warpage compatible with subsequent assembly processing.

Furthermore, for the past several years, microelectromechanical systems (MEMS) structures have been playing an increasingly important role in consumer products. For example, MEMS devices, such as sensors and actuators, can be found in products ranging from inertial sensors for air-bag triggers in vehicles to micro-mirrors for displays in the visual arts industry and, more recently, in mobile applications such as accelerometers for determining the orientation of the mobile device or air pressure sensors for altitude sensing. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictate that the processes used to fabricate such MEMS devices need to be extremely sophisticated.

Although packaging scaling is typically viewed as a reduction in size, the addition of functionality in a given space is also considered. However, structural issues may arise when attempting to package semiconductor die with additional functionality also housed in the package. For example, the addition of packaged MEMS devices may add functionality, but ever decreasing space availability in a semiconductor package may provide obstacles to adding such functionality.

BRIEF DESCRIPTION OF THE DRAWINGS

FIGS. 2A and 2B illustrate a top plane and side cross-sectional view of an accelerometer that can be fabricated in accordance with an embodiment of the present invention.

DESCRIPTION OF THE EMBODIMENTS

Figure 1A:
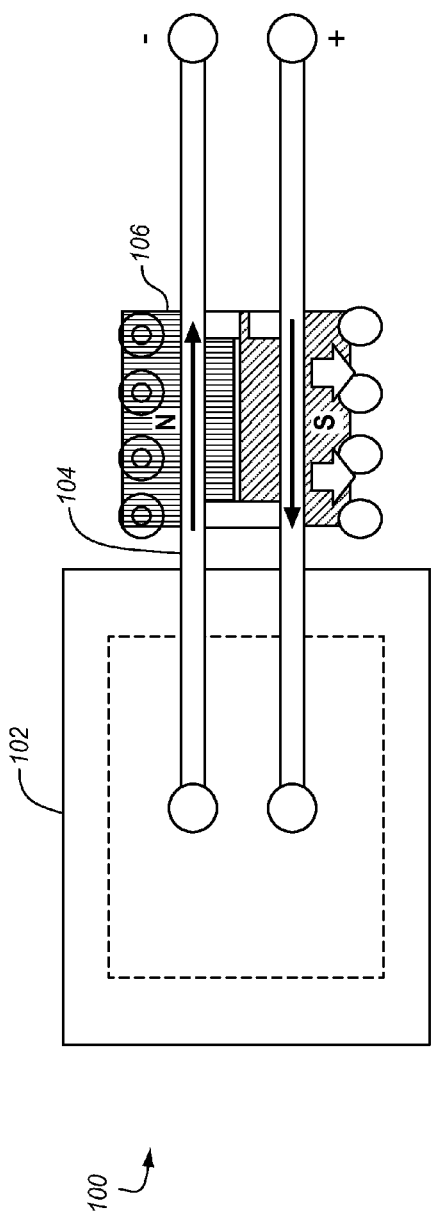
FIGS. 1A and 1B illustrate a top plane and side cross-sectional view of a pressure sensor that can be fabricated in accordance with an embodiment of the present invention.

Semiconductor packages with pressure or inertial sensors are described. In the following description, numerous specific details are set forth, such as packaging architectures, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to semiconductor packages having one or more microelectromechanical systems (MEMS) structures incorporated therein. In one such embodiment, an air pressure sensor is fabricated in traditional (with or without a core) substrate processing layers. In other embodiments inertial sensors, such as accelerometers or gyroscopes are fabricated in traditional or coreless substrate processing layers. Structures or devices described herein may have applications in one or more of mobile/consumer products which use traditional or coreless substrate technology.

The described devices use three layers to process and as such can be easily incorporated with any architecture that uses three or more layers. Silicon nitride processing is used for forming the cavity of the diaphragm of the substrate. For inertial sensors, a reverse flow is presented in which a magnet is attached at the end of the process, as needed.

The same process flow may be used for both pressure sensors and microphones. These can be fabricated side-byside (horizontal integration) or one on top of the other (stacking or vertical integration). Stacked formations are described using only one additional layer for a total of four. Vertical combinations reduce the sensor area footprint on the package.

Traditional or coreless substrate packaging technology is often used in packaging dies for mobile devices. Air pressure or acoustic sensors are important for consumer mobile devices, providing microphones, altimeters, and barometers. Accordingly, in an embodiment, an air pressure sensor is fabricated in or via traditional or coreless substrate packaging technology. As a comparison, conventional, discrete air pressure sensors are typically relatively thick compared to a silicon die. The approach described provides for a much thinner sensor and mitigates the costs associated with separately fabricated air pressure sensors. The same applies to inertial sensors.

A variety of different embodiments are described herein. In one embodiment, the sensor fabrication is horizontally integrated into the standard substrate flow. The sensor may be a pressure sensor or microphone in one example, or an accelerometer or a gyroscope in another example. In another embodiment, the sensor fabrication is horizontally integrated into the standard substrate flow without bumps. In another embodiment, both an accelerometer or gyroscope and a pressure sensor or microphone are horizontally integrated into the standard substrate fabrication flow.

In another embodiment, the inertial sensors, such as accelerometers or gyroscopes are fabricated in a vertical package configuration. The accelerometers and gyroscopes can be fabricated vertically or stacked. The stacked configuration may be used to reduce the number of magnets. A single magnet may be placed over two inertial sensors and its magnetic field may be used for both sensors, depending on the particular implementation. In another embodiment, the inertial sensors, such as accelerometers or gyroscopes are fabricated in a vertical package configuration without bumps.

In some embodiments, silicon nitride is used to form the cavity diaphragm for the pressure sensor or microphone. In another embodiment, solder resist is used in combination with a patterned support mesh to close a diaphragm cavity. For inertial sensors, pick and place tools may be used in combination with die backing film (DBF) to attach a magnet on the top side of a panel as compared to using embedded magnets.

As mentioned above, standard substrate processing flows and techniques may be used to form sensors of various kinds at the same time that routing layers and structures are being formed in another section of a substrate. To do so new techniques may be used to form structures that are used by the sensors. For an example, a diaphragm cavity may be etched into a dielectric and then be closed through the use of a support mesh and solder resist lamination. The support mesh may be optimized to allow for ABF (Ajinomoto Build-up Film) etching under the support mesh while still providing sufficient structure to support the laminated solder resist.

Another new technique is to use a die mount process to place and mount a magnet for use with an inertial sensor. A die backing film (DBF) similar to the current die mount process may alternatively be used to attach the magnet. This makes the magnet attachment process more similar to the standard substrate package process. Alternatively, an adhesive film or tape may be used to secure the magnet, or the magnet may be thermally bonded to the package (e.g. by soldering) after the appropriate metallization is applied.

Sensors may be stacked vertically to allow one magnet to actuate multiple sensors. Alternatively, multiple sensors may be fabricated horizontally and use separate magnets to actuate each device.

In typical substrate fabrication, standard organic build-up layers like Ajinomoto buildup film (ABF) or FR4 are used to form many of the structures. This may be used to form some aspects of a sensor but may not form an airtight seal for use in a diaphragm or reference cavity. A copper via ring or silicon nitride may be used to form a hermetically sealed package for the reference air pressure or any other purpose. In one example air pressure sensor, the top surface of the sealed package acts as a diaphragm and is the bottom electrode for the electrostatic sensing mechanism. In this arrangement, as the air pressure of the environment changes, sensed capacitance between the two electrodes changes. Sufficient sensitivity may be achieved for the ranges of interest for consumer products. In one embodiment, a "continuous via ring" method is adaptable for other MEMS applications requiring a reference air cavity or hermetic sealing of structures.

Figure 1B:
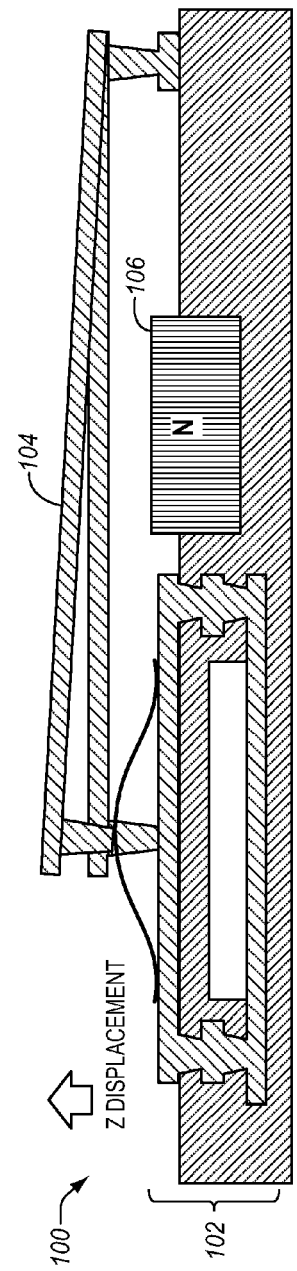

As an example of an air pressure sensor that can be fabricated using traditional or coreless substrate techniques, FIG. 1A shows a diagram of a magnetically-actuated beam that may be fabricated in a patterned metal layer and used in conjunction with a pressure diaphragm fabricated as described below. FIG. 1A is a top plan view diagram and FIG. 1B is a corresponding cross-sectional side view diagram of a magnetically-actuated resonant beam air pressure sensor, in accordance with an embodiment of the present invention. However, a variety of other different types of pressure sensors may be fabricated of in metal layers using the techniques described herein.

In this example, a magnetically-actuated resonant beam air pressure sensor 100 includes a diaphragm 102, resonant beams 104 and an embedded magnet 106. Resonant beams are actuated through the interaction of an AC current with a permanent magnet. The diaphragm is deflected due to a difference in air pressure. This deflection will cause a displacement along the Z axis. The displacement applies tension to the resonant beams and increases the resonant frequency of the beams. The change in resonant frequency can be measured by other circuitry (not shown) and related to the air pressure, altitude, water depth, sound waves or any other desired ambient pressure value. Although the magnet is embedded in this example, it can be attached as an external component to the package substrate after fabrication of the substrate, using any of the attachment mechanisms described above (e.g. using DBF, adhesive tape, solder, etc)

FIG. 2A is a top plan view diagram of an accelerometer 200 that can be fabricated using traditional or coreless substrate techniques. A proof mass 202 acts as the inertial mass of the accelerometer and can be fabricated in a patterned metal layer. The proof mass is suspended above and between a pair of magnets 204A, 204B that underlie respective coils 206A, 206B. Each coil accommodates a see-saw movement about the X axis. The coils are each supported by a respective beam 208A, 208B.

The beams are anchored at each end by a respective anchor 210A, 210B, 210C, 210D. The anchors provide mechanical support to the beams and electrically connect the accelerometer circuit. Together each coil and its respective components, anchors and magnet form a detector arm 212A, 212B.

FIG. 2B is a side cross-sectional view diagram of the accelerometer showing the magnets 204A, 204B and their relationship with the beam 208A (not visible), 208B. When exposed to an acceleration in the right direction, the proof mass moves and thereby induces a mechanical tension in the beams increasing the resonant frequency of the beams. The change in resonant frequency can be measured by other circuitry (not shown) and related to the acceleration or change in direction of movement of the package.

Figure 3:
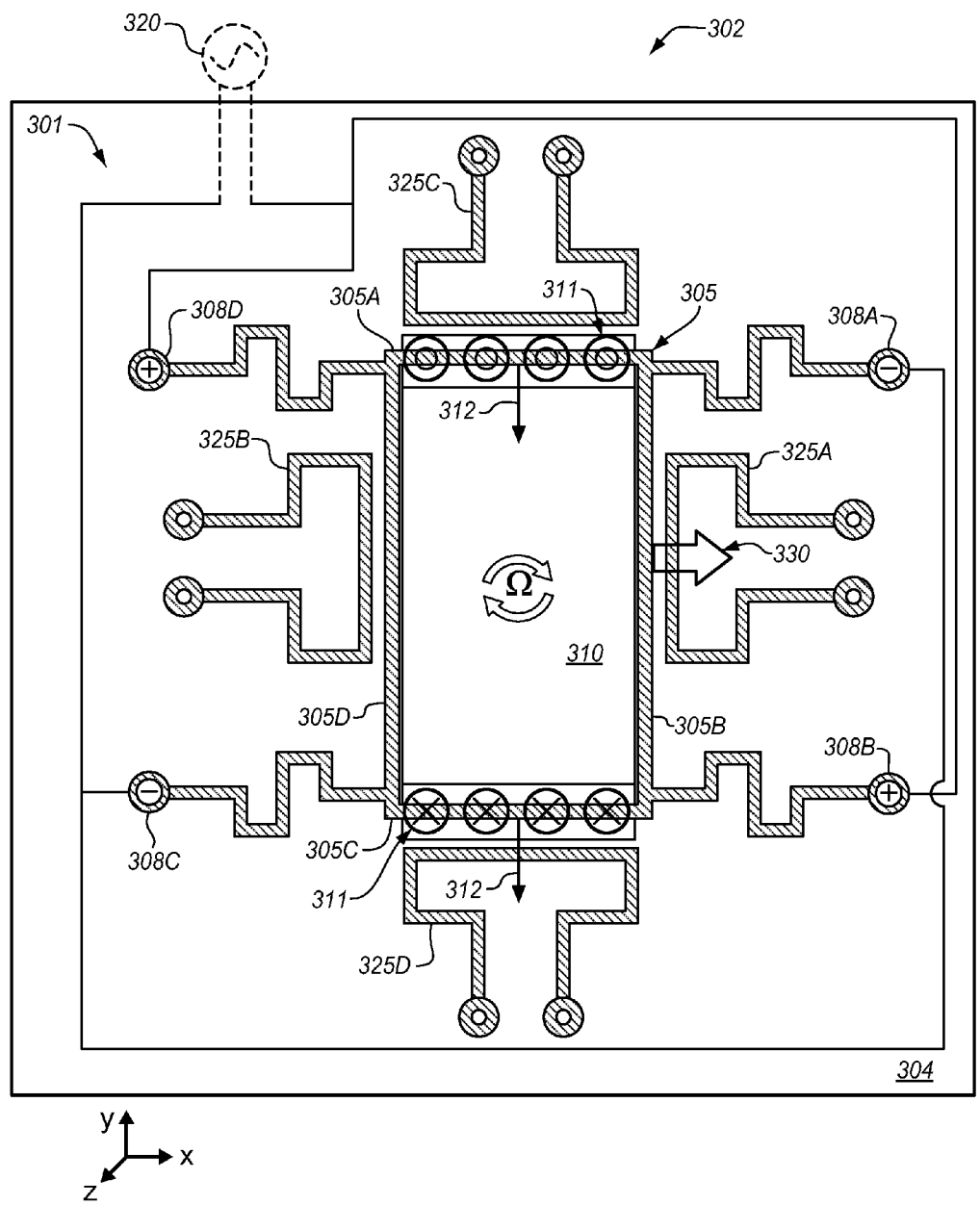
FIG. 3 illustrate a top plane view of a gyroscope that can be fabricated in accordance with an embodiment of the present invention.

As an example of gyroscope that can be fabricated using standard substrate techniques, FIG. 3 shows a top plan view diagram of an inductive gyroscope 301, in accordance with an embodiment of the invention. As shown, a conductive drive coil 305 is disposed over a substrate 304 and anchored to the substrate by conductive anchors 308A, 308B, 308C, and 308D (e.g., Cu vias). The drive coil 305 is parallel to the plane of the substrate 304 and can be formed in a patterned metal layer over a dielectric layer of the package substrate. The exemplary drive coil has orthogonal segments 305A, 305B, 305C, and 305D forming one continuous conductive trace loop.

The drive coil is positioned over a magnet 310 and within its magnetic (B) field 311. The magnetic field 311 is perpendicular to the plane of the substrate 304 with the field 311 emanating away from, and returning to the substrate 304 at the north and south poles, respectively, as illustrated.

A drive signal generator 320 provides a time varying current (e.g., sinusoidal) through the drive coil 305 generating an electromagnetic force 312 so that the drive coil 305 vibrates in one dimension relative to the substrate 304. When an external angular rotation occurs about an axis of rotation along an orthogonal dimension, the Coriolis force causes the vibrating drive coil to be displaced along a third dimension 330, orthogonal to the first and second dimensions.

Sense coils 325A, 325B register a mutual inductance induced by displacement of the drive coil 305. A first pair of sense coils 325A, and 325B is positioned on opposite side of the drive coil and parallel to two of the drive coil segments. The sense coils are fastened to the substrate and do not vibrate. Mutual inductance within the sense coils varies as a function of drive coil displacement in both the x and y dimensions. The displacement of the coil in the x-dimension resulting from the external rotation with angular velocity Ω creates a time dependent flux across the sense coils, which in turn induces a voltage across each sense coil that is correlated to the angular velocity Ω. Through signal processing in other circuitry (not shown), a differential signal derived from the voltage signals registered by each of the sense coils may be used to determine the angular velocity Ω. Additional sense coils 325C and 325D are formed parallel to the other two drive coil segments 305A and 305B.

As described, the air pressure sensor in one embodiment is formed from suspended copper and solder resist features and from electrodes formed above a reference cavity. The air pressure sensor compares the ambient air pressure with the reference air pressure in the cavity through capacitive coupling. The capacitive coupling (C) is determined by the distance between the cavity diaphragm and the underlying structure formed above the reference cavity. The difference between ambient air pressure and reference air pressure is detected by an upwards or downwards deflection of the diaphragm that covers the reference cavity. The sensed capacitance reflects the extent of downward or upward deflection of the diaphragm.

Alternatively, a magnetically-actuated resonant beam air pressure sensor can be used. In this case, diaphragm deflection induces a tension in the resonant beams. The change in diaphragm height contributes to a change in beam length which translates into beam tension and an increased beam resonant frequency.

A packaged MEMS device, such as an air pressure sensor, may be housed in a variety of packaging options. The structure as depicted can be viewed as a completed package for a combined semiconductor die and sensor. However, for specific implementations, an array of external contacts (e.g., BGA contacts) may optionally be formed above or below the depicted structure. The resulting structure may then be coupled to a printed circuit board (PCB) or similar receiving surface.

Active surfaces of the packaged semiconductor die may include a plurality of semiconductor devices, such as but not limited to transistors, capacitors and resistors interconnected together by an interconnection structure to form functional circuits. Using semiconductor die fabrication techniques, a device side of the semiconductor die may be formed. The die may include semiconductors for any of a variety of different integrated circuit devices including but not limited to a microprocessor (single or multi-core), a memory device, a chipset, a graphics device, an application specific integrated circuit according to several different embodiments. In another embodiment, more than one die is embedded in the same package. For example, in one embodiment, a packaged semiconductor die further includes a secondary stacked die. The first die may have one or more through-silicon vias disposed therein (TSV die). The second die may be electrically coupled to the TSV die through the one or more through-silicon vias. In one embodiment, both dies are embedded in or attached to a substrate.

Figure 4A:
FIGS. 4A-4S illustrate cross-sectional views of various operations in a method of fabricating a pressure sensor with a reference cavity in accordance with an embodiment of the present invention.

FIG. 4A is a cross sectional side view diagram of a peelable core 400 as the incoming starting material for producing a sensor, for example a pressure sensor in a horizontal configuration. The pressure sensor can be combined with any of a number of other micromachined or electronic components such as transistors and circuitry. The incoming peelable core has an organic carrier 402 at its center which is covered on both sides with a laminated Cu foil 404 and a peelable Cu layer 406. Layer 406 is weakly adhered to the laminated Cu foil 404 so that it can be peeled off after all the substrate fabrication processes are completed.

Figure 4B:
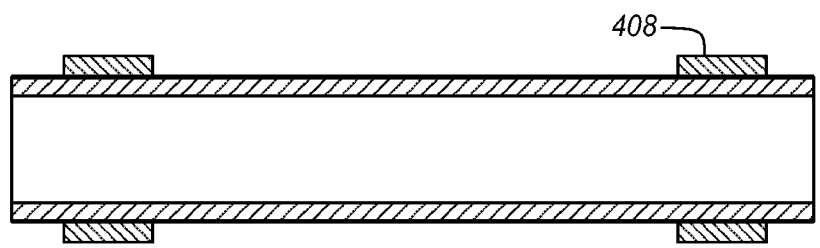
Figure 4C:
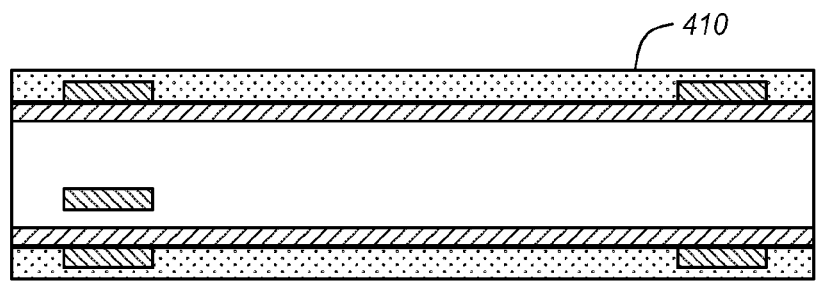

In FIG. 4B a dry film resist (DFR) is applied over the core and copper is deposited over the DFR pattern. After the DFR is removed a pattern of copper lands 408 remains. These lands may be used for connections to external devices after the substrate manufacturing process is completed. In FIG. 4C a build up layer 410 is deposited over the core and the copper lands.

Figure 4D:
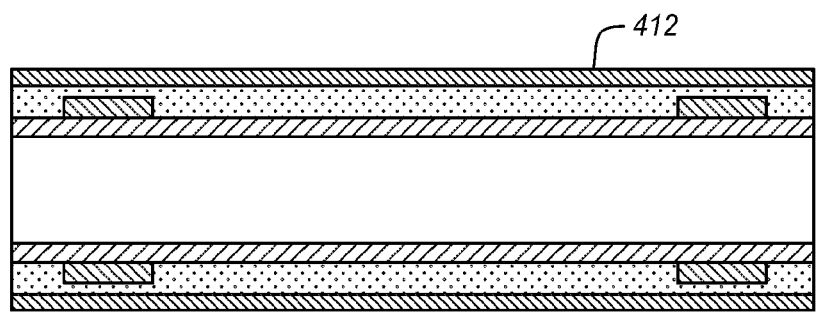
Figure 4E:
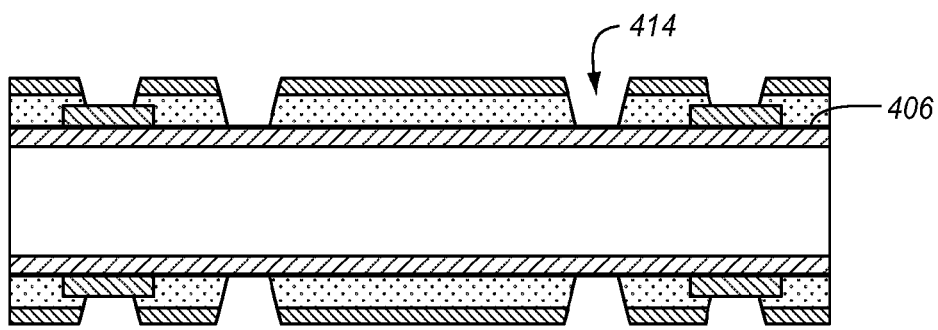

In FIG. 4D a diaphragm coating layer 412 is applied over the build-up lamination. The diaphragm coating may be fabricated from silicon nitride or any of a variety of other materials including SiO2, SiON, SiCN, or SiCON. After the coating layer is applied, for example by deposition, then it may be etched in any desired pattern. In FIG. 4E laser etching is used to create specific individual areas 414 for copper filling. The silicon nitride diaphragm coating is formed in any desired pattern. These layers may include routing layers for electronic devices or micromachined layers such as beams, coils, or weights for any of variety of different sensors.

Figure 4F:
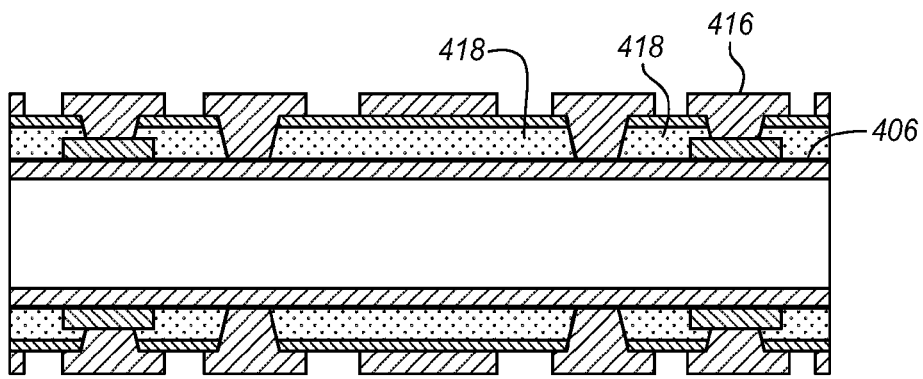

In FIG. 4F a second metal layer is applied over the diaphragm layer. The second metal layer 416 is applied over the buildup layer and into the valleys 414 that were formed by etching. This copper pattern may be used for routing layers as well as for connections to vias that are formed in other layers within the resulting die. In FIG. 4E valleys 414 may be laser etched through to the core 406. These valleys may be filled as desired to form vias 418 that extend from the outermost layer of the die down to the core 406. A pattern of copper lines 416 may be applied over these vias to make appropriate connections to various other vias. In addition this routing layer may form appropriate components of the micromachined structures shown for example in FIGS. 1, 2 and 3, such as beams, coils, masses, and meshes.

Figure 4G:
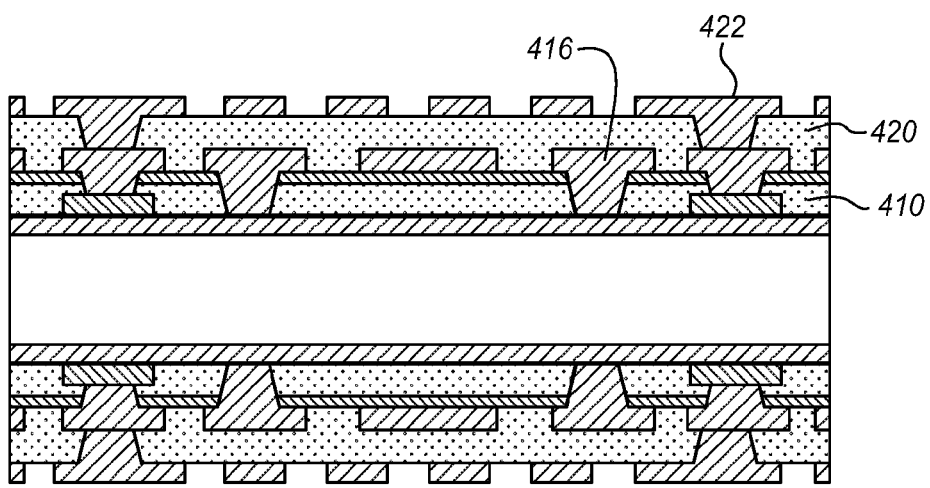

In FIG. 4G a second dielectric layer 420 is formed over the first metal layer 416 and a second metal layer 422 is formed over the second dielectric layer 420. The second metal layer may include metal meshes, routing layers and other components.

Figure 4H:
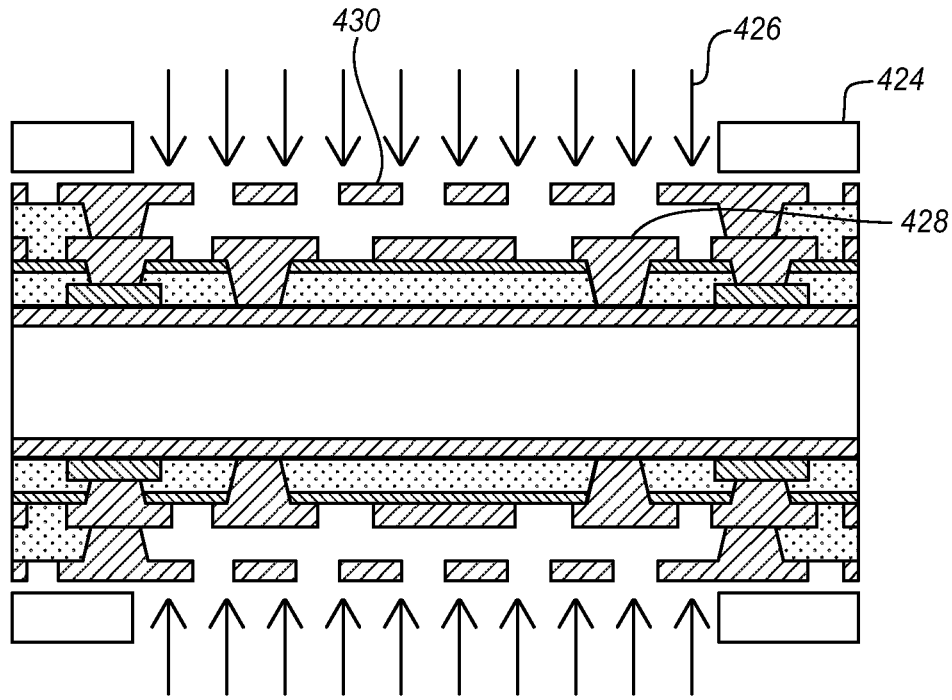

In FIG. 4H a plasma mask 424 is applied on both top and bottom sides of the structure. Buildup layer etching 426 may then be used to remove the buildup layers in appropriate locations. As shown in FIG. 4H after etching there is a lower mesh layer 428 formed from the first copper layer and an upper mesh layer 430 formed from the second copper layer. In other locations of the substrate routing layers and other parts of the device may be protected by the plasma mask 424. These layers may not be affected by the etching process. The metal mesh layers 428 and 430 provide enough structure to support the layers that will be applied above and yet still allow for ambient access to a pressure sensor diaphragm or for generating various fields.

Figure 4I:
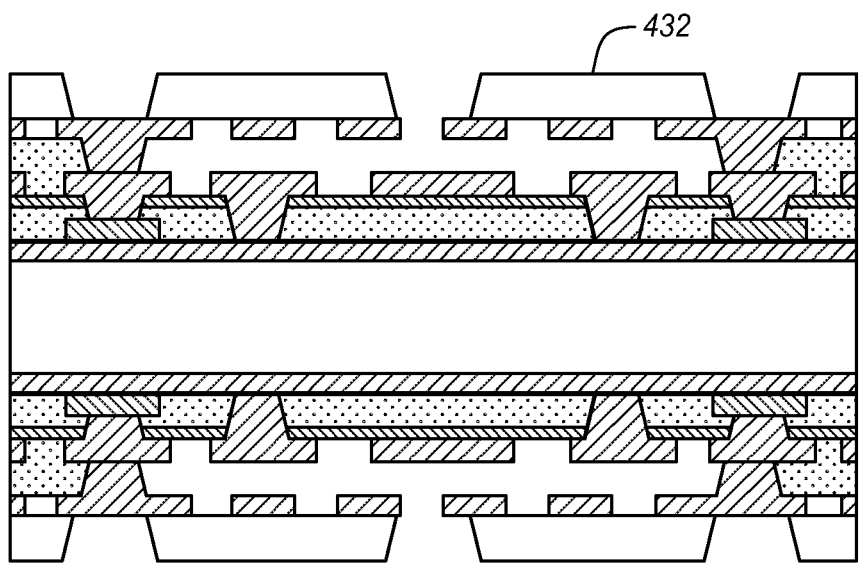

In FIG. 4I a solder resist pattern 432 is formed over the metal mesh layers. The metal mesh is sufficiently dense to support the solder resist pattern that is applied over the metal mesh.

Figure 4J:
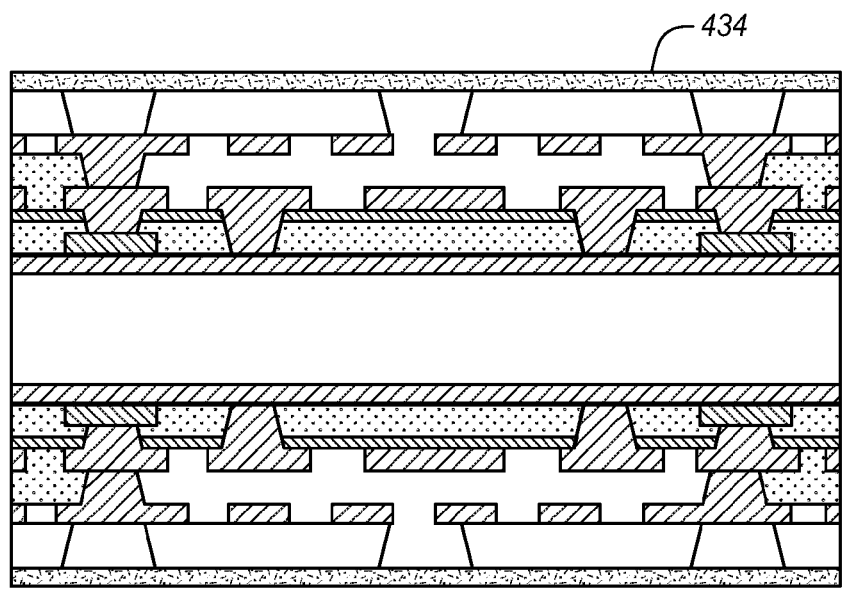
Figure 4K:
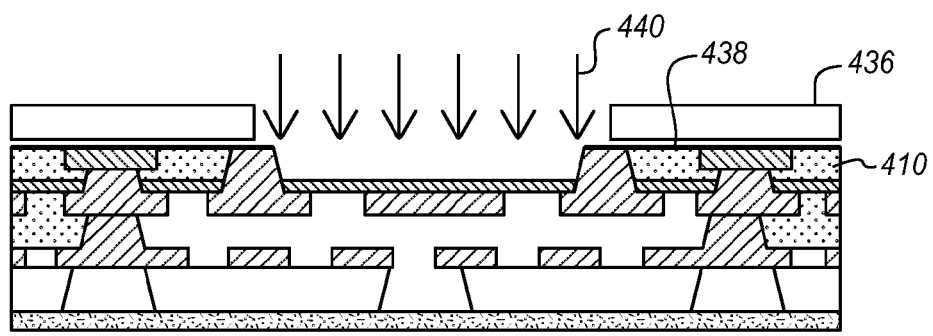

In FIG. 4J a polymer film 434 such as PET (Polyethylene Terephthalate) is applied over the solder resist pattern by lamination or any other desired way. This polymer film 434 will protect the solder resist during other processes. In FIG. 4K the peelable carrier is removed from the structure after the structure has been built up.

Figure 4L:
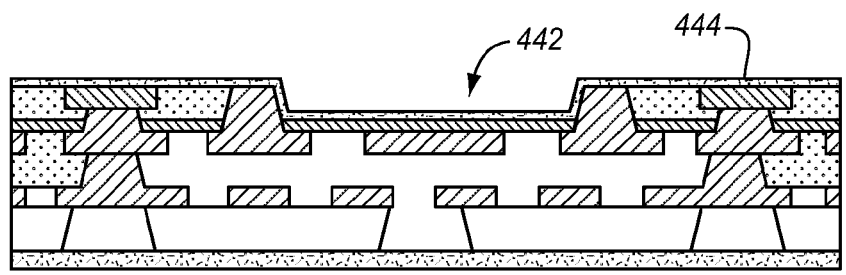

FIG. 4K shows the lower half of the substrate and layers that have been formed after the peelable Cu is etched away. The two halves of the structure are de-paneled from the temporary cores removing the carrier and the upper half of the structure. This allows for access to the backside of the die from above. A plasma mask 436 is applied over the back side of the structure 438 after which a buildup etching process 440 is applied to the back side of the structure. The buildup etching removes a portion of the original lamination 410 that was applied over the carrier. This creates a cavity 442 as shown in FIG. 4L.

The cavity may be lined with some sort of sealant for example 444 silicon nitride. The silicon nitride coating is an air tight coating or a water tight coating for the pressure sensor depending on the particular application. While silicon nitride is shown, other materials may also be used to seal the cavity 442 such as SiO2, SiON, SiCN, SiCON.

Figure 4M:
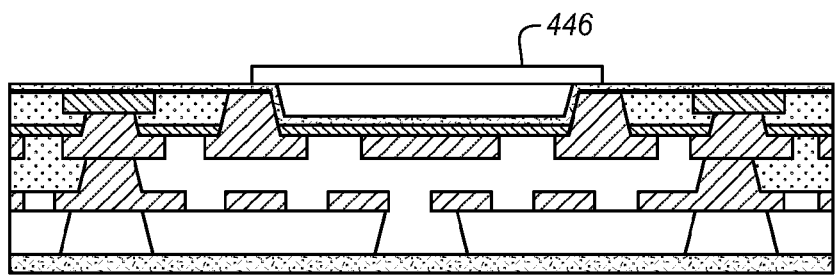

In FIG. 4M the cavity is covered with a cover 446 made of any desired material. In one example solder resist is patterned over the cavity and used as a cover. In another example a thin metal sheet is used as a cover.

Figure 4N:
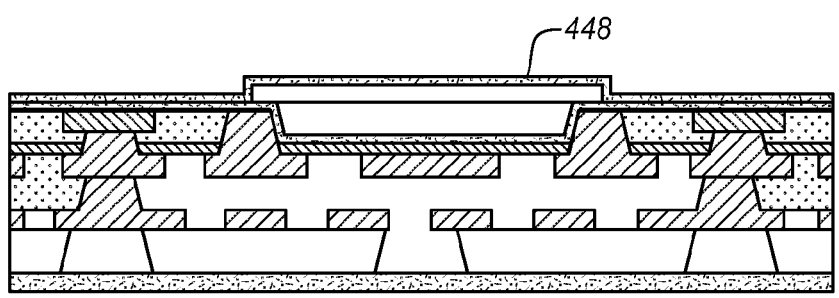

In FIG. 4N a silicon nitride coating 448 is applied over the solder resist pattern to protect it from the environment and to seal it air tight.

Figure 4O:
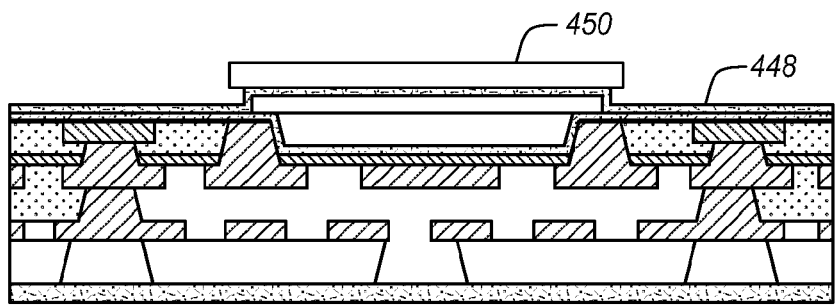
Figure 4P:
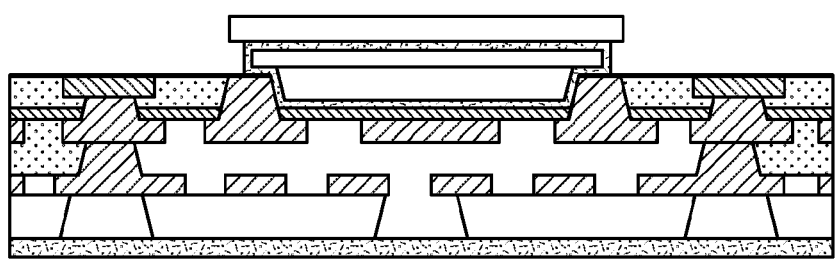
Figure 4Q:
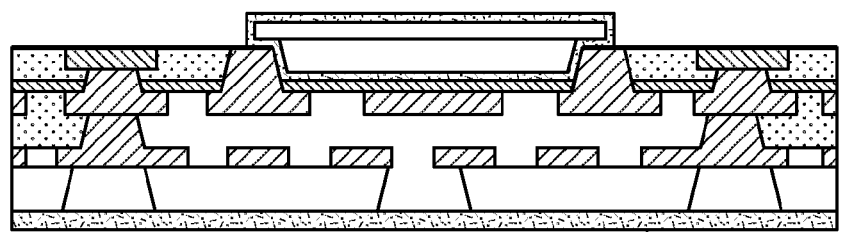
Figure 4R:
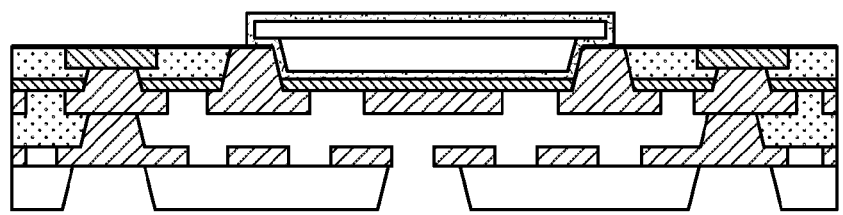

In FIG. 4O a dry film resist (DFR) 450 is patterned over the back side of the structure to cover the diaphragm area. This allows then in FIG. 4P for the silicon nitride layer 448 to be removed around the diaphragm. In FIG. 4Q the dry film resist may be stripped off. And in FIG. 4R the PET film on the front side of the structure may also be removed.

Figure 4S:
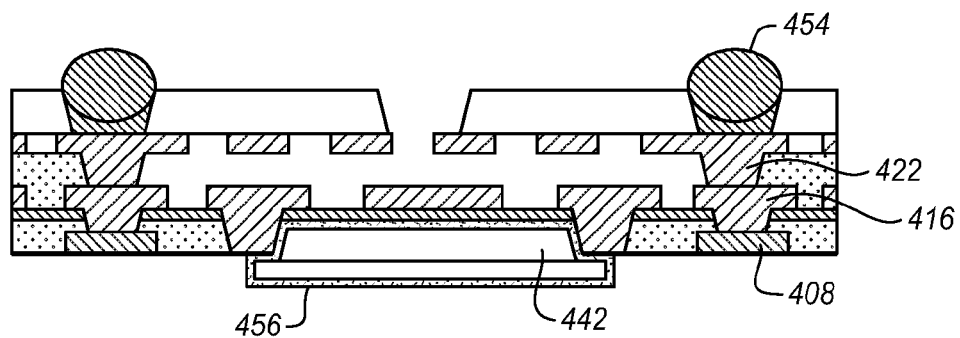

Finally in FIG. 4S solder bumps 454 are applied to contact pads in the structure which connect through vias to the first and second metal layers. These also allow for connections to the diaphragm cavity 442 and the completed pressure sensor 456. The pressure sensor responds to changes in pressure by bending the diaphragm as explained above.

Figure 5A:
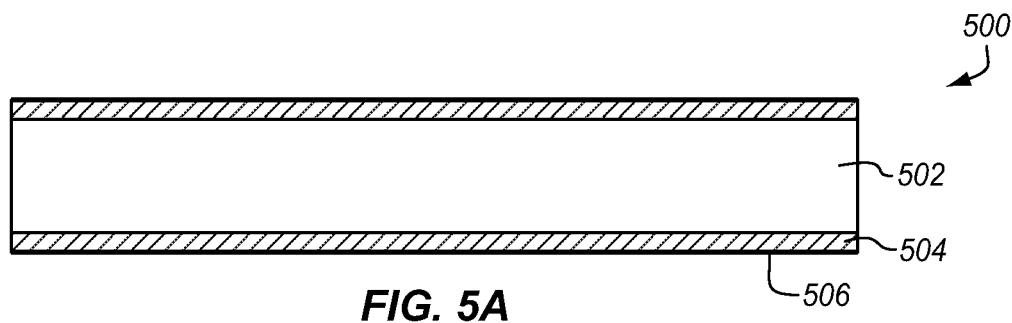
FIGS. 5A-5K illustrate cross-sectional views of various operations in a method of fabricating an inertial sensor in accordance with an embodiment of the present invention.

FIG. 5A is a side cross-sectional diagram that shows an example of the use of an incoming peelable core 500 for use in fabricating an inertial sensor such as an accelerometer or a gyroscope. The inertial sensor may be fabricated using conventional substrate processing techniques. The incoming peelable core has an organic carrier 502 at its center which is covered on both sides with a laminated Cu foil 504 and a peelable Cu layer 506. Layer 506 is weakly adhered to the laminated Cu foil 504 so that it can be peeled off after all the substrate fabrication processes are completed.

Figure 5B:
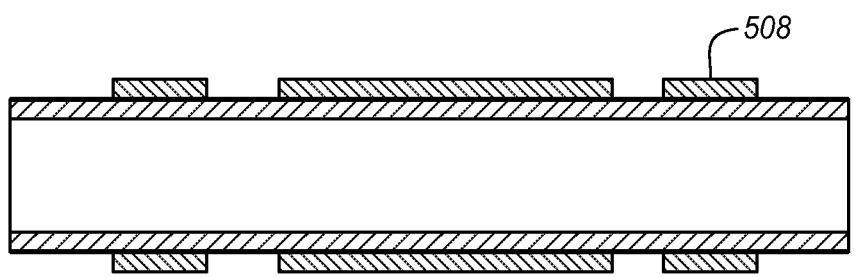
Figure 5C:
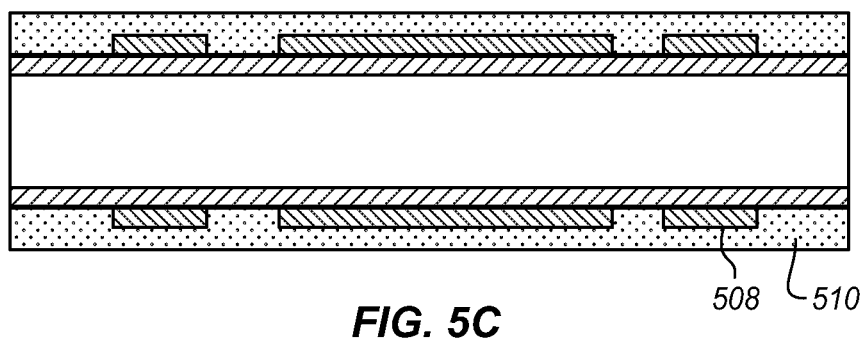
Figure 5D:
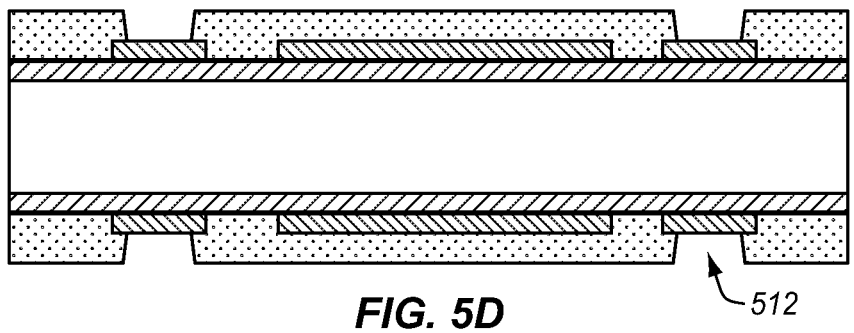
Figure 5E:
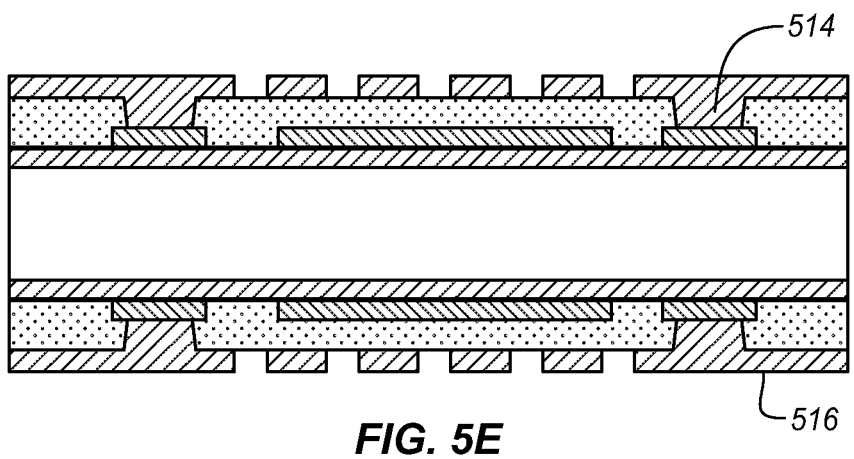

In FIG. 5B a dry film resist (DFR) pattern is used to apply copper plating according to a specific intended pattern. A pattern of lands 508 for routing layers and connections are formed on both sides of the core over the peelable Cu layer 506. In FIG. 5C a buildup layer 510 is laminated over the copper plating. In FIG. 5D laser etching is used to form valleys 512 in the buildup lamination. In FIG. 5E copper is applied into the valleys 512 to form vias 514 and a second metal layer 516 is applied over the buildup. The second metal layer may be in the form of a wire mesh and may also include routing layers as desired to connect the mesh with the vias and any other components that are to be formed.

Figure 5F:
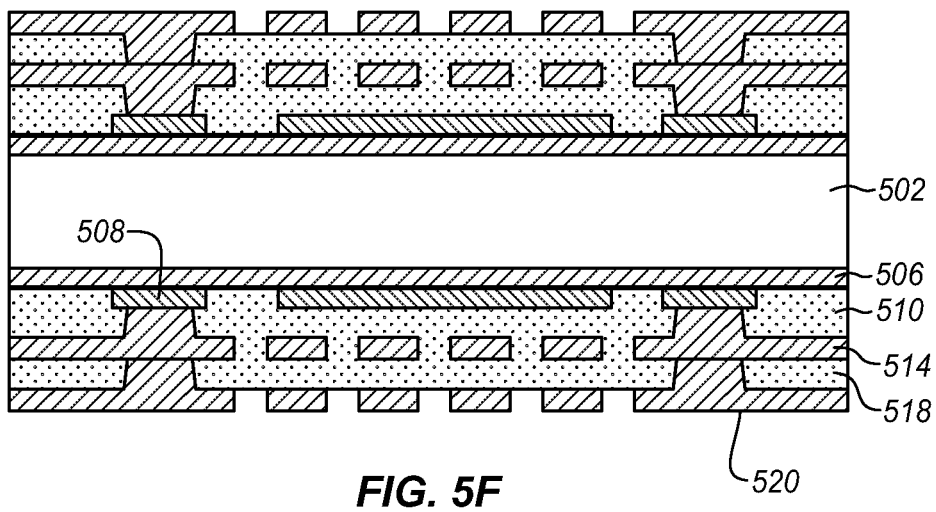

In FIG. 5F the operations of depositing buildup and patterning metal over the buildup are repeated with a second layer of dielectric 518 and a second metal layer 520 to form a second mesh pattern over the dielectric and over the first mesh.

Figure 5G:
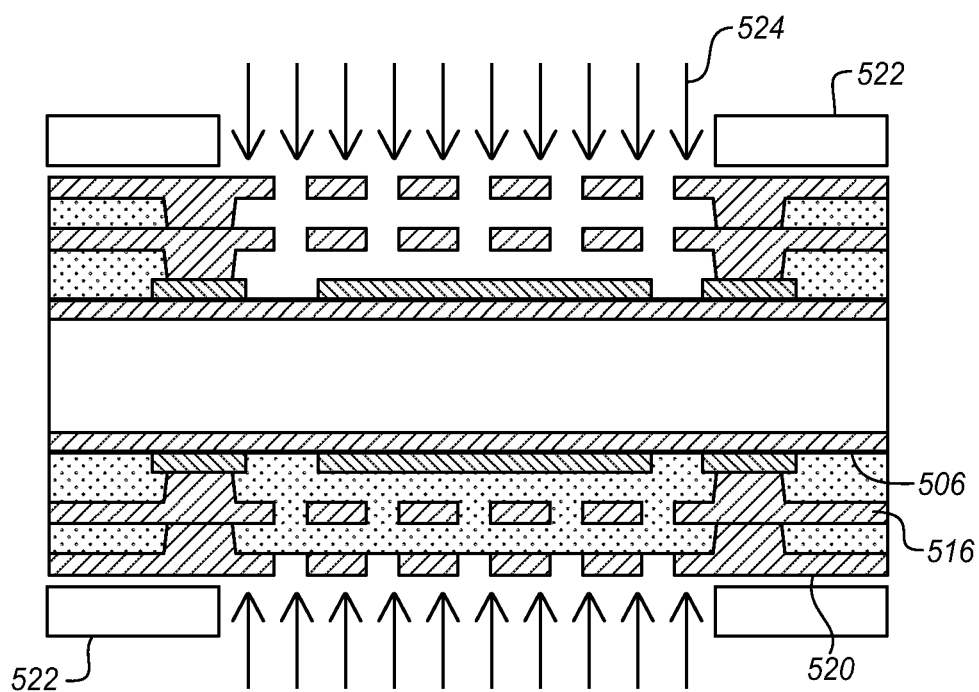

In FIG. 5G a plasma mask 522 is applied on both sides of the structure and buildup etching 524 is applied to the structure. The metal mask determines which areas will be etched and the buildup in the exposed area is completely removed. This provides for two layers of metal mesh 516, 520 with no intervening materials. However, dielectrics remain in areas that were not exposed to the etching process.

Figure 5H:
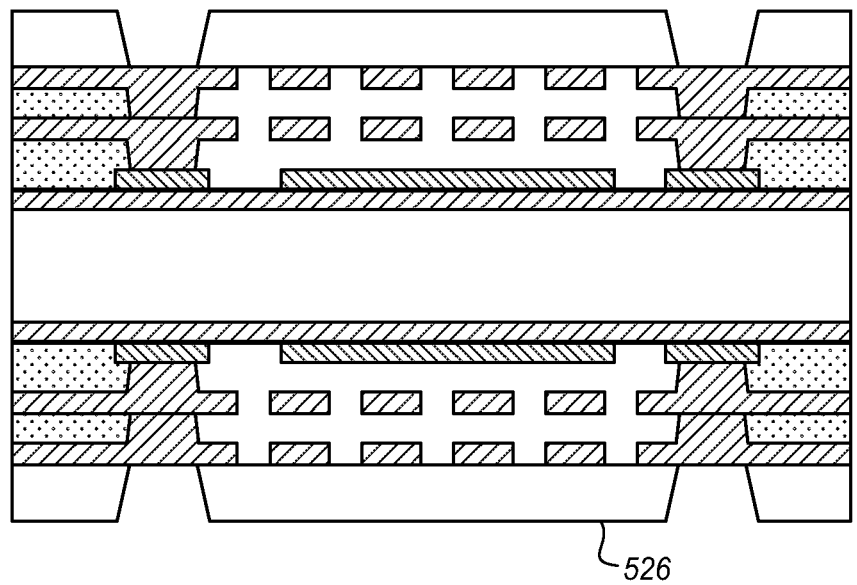
Figure 5I:
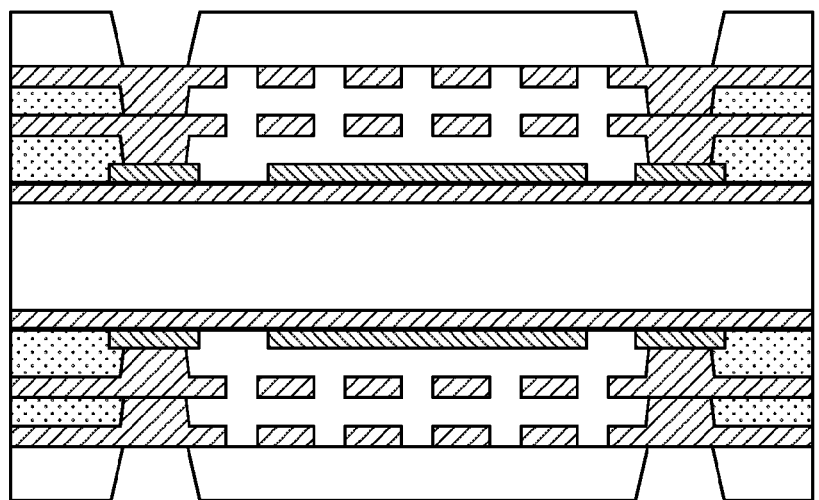

In FIG. 5H a solder resist pattern 526 is applied over the etched areas to protect the metal mesh from other processes and to provide a structure for the sensor system. In FIG. 5I, the peelable Cu in the core has been removed to separate the top and bottom substrate portions on either side of the core, and the top substrate portion is retained.

Figure 5J:
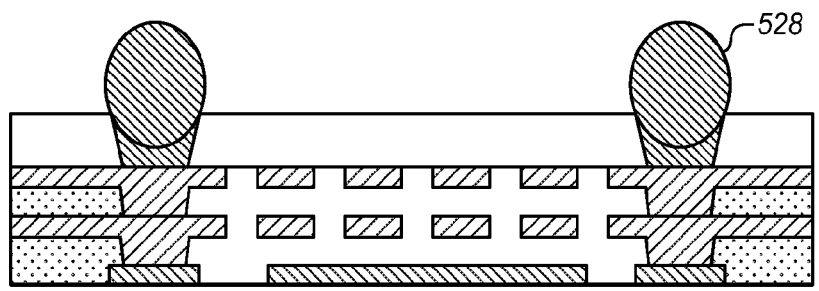
Figure 5K:
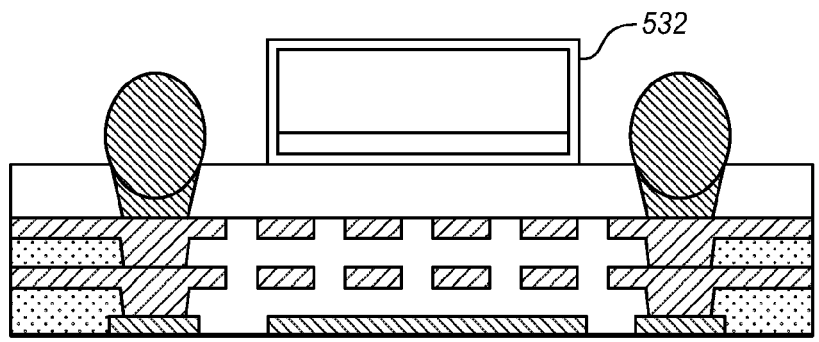

In FIG. 5J the first dielectric layer has been de-paneled from the supporting substrate. The solder bumps 528 are applied over the vias to connect external components to the first and second mesh layers after the peelable Cu in the core has been removed to separate the top and bottom substrate portions on either side of the core. Any of a variety of other electrical technologies may be used instead of solder bumps to connect external components depending on the particular implementation. In FIG. 5K a magnet 532 has been placed over the first and second mesh layers for use as described above in building an inertial sensor.

Figure 6A:
FIGS. 6A-6V illustrate cross-sectional views of various operations in a process flow for fabricating a pressure sensor horizontally beside an inertial sensor in accordance with an embodiment of the present invention.

FIG. 6A is a side cross-sectional diagram that shows an example of how an inertial and a pressure sensor may be fabricated in a horizontal or a side-by-side configuration using common processes in a single fabrication process flow.

Figure 6B:
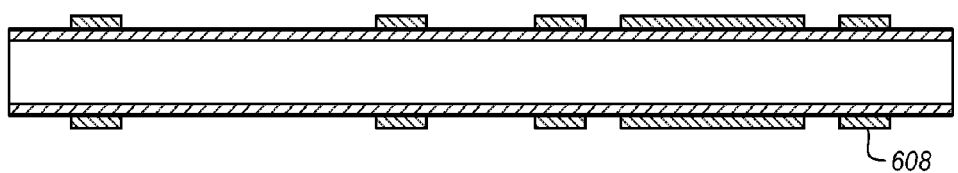

In FIG. 6A, a peelable core 600 has an inner organic carrier 602, an outer Cu film 604 and a peelable Cu layer 606 over the outer Cu film 604. In FIG. 6B a first metal pattern 608 is formed over the peelable Cu layer for example using photoresist patterning, copper metal deposition, and etching.

Figure 6C:
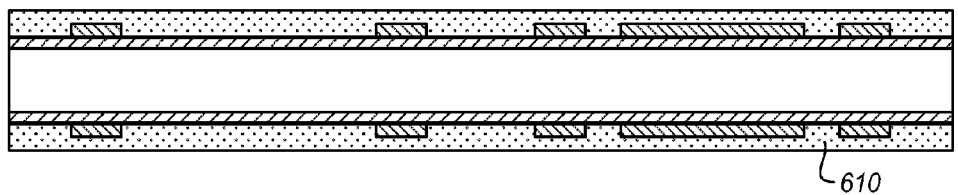
Figure 6D:
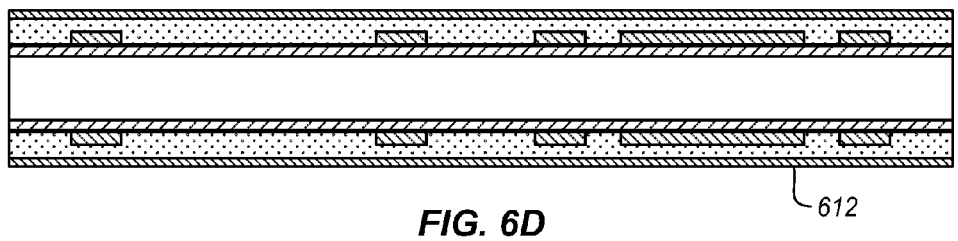

In FIG. 6C a first buildup layer 610 is laminated over the copper pattern layers 608. In FIG. 6D a diaphragm coating 612 is applied over the buildup lamination 610. As mentioned above, the diaphragm coating may be silicon nitride or other materials such as SiO2, SiON, SiCN, or SiCON.

FIG. 6E shows a dry film resist patterned over portions of the buildup and coating structure. The dry film resist 614 masks some of the diaphragm layer 612. In FIG. 6F after etching the diaphragm layer is removed over portions of the die. The diaphragm layer is removed from the portion which is to be used for the inertial sensor and remains over the portion that is to be used for the pressure sensor. In this example the inertial sensor is to be formed on the right hand side and the pressure sensor is to be formed on the left hand side of the structure as shown in FIG. 6F. In FIG. 6G the dry film resist is removed leaving the diaphragm coating in only some parts of the structure.

Figure 6I:
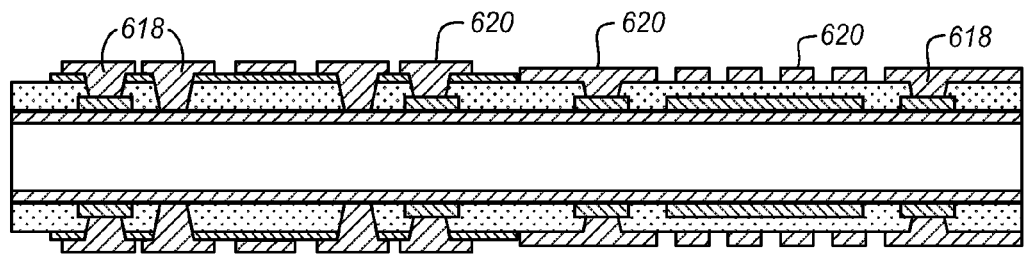
Figure 6J:
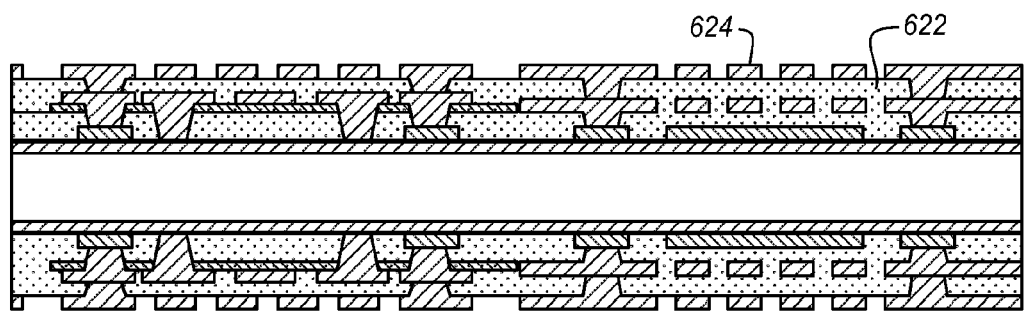

In FIG. 6H laser etching forms valleys 616 in appropriate portions of the structure and in FIG. 6I these valleys are filled with copper to form vias 618 and a second copper layer 620 is patterned over the vias and the remaining buildup layer. In the case of the inertial sensor a mesh is formed by the second copper layer for use with the inertial sensor.

Figure 6K:
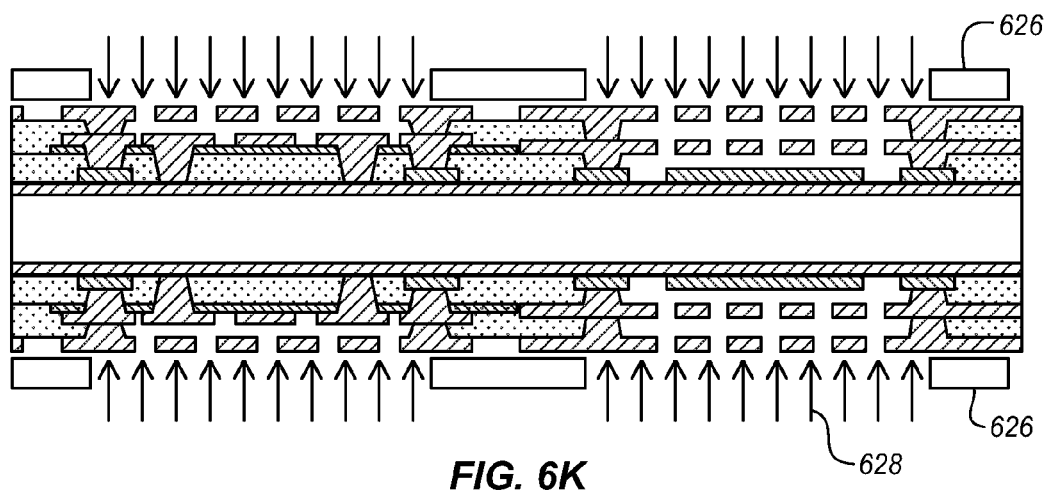

In FIG. 6I an additional dielectric buildup layer 622 is applied over the first dielectric layer and the second metal layer with the mesh. A third metal layer 624 is applied over the dielectric. In FIG. 6K a plasma mask 626 is patterned over the structure to protect areas of the buildup layer and the remainder of the buildup layer is etched using an etch process 628 through the openings in the mask. This removes the buildup material for the inertial sensor and for the pressure sensor.

Figure 6L:
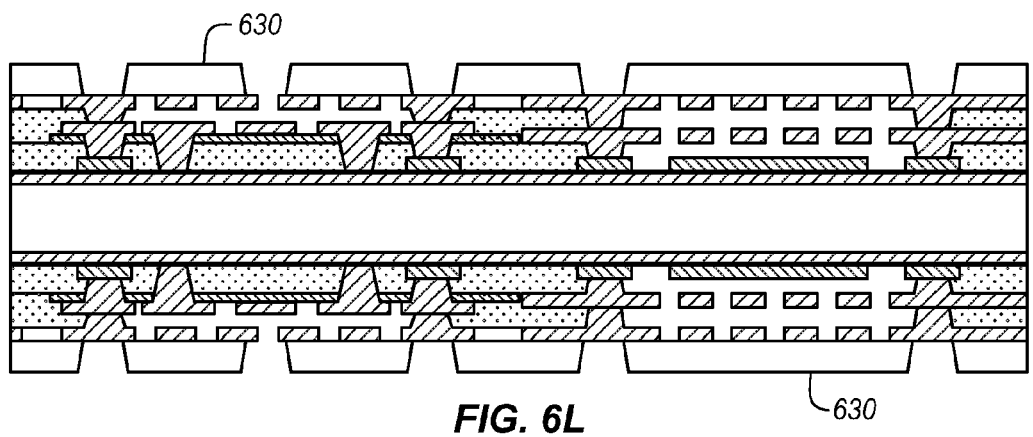
Figure 6M:
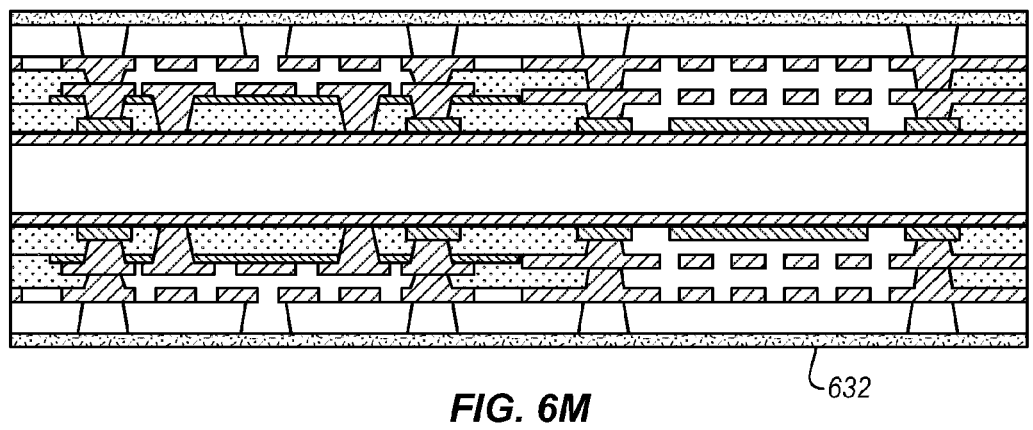

In FIG. 6L solder resist 630 is patterned over the structure to form a structure for the interconnection layer of the device. The solder resist is patterned conventionally using for example photolithography or screen printing. In FIG. 6M a PET film 632 is laminated over all the solder resist to cover the top and bottom sides of the structure and protect the photoresist.

Figure 6N:
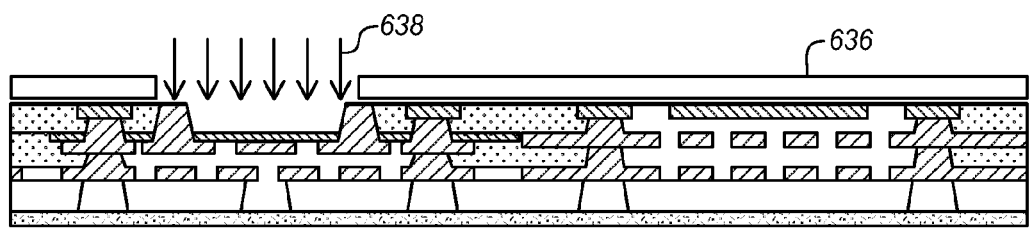

In FIG. 6N the two opposite side are de-paneled from the carrier by is removing the peelable carrier. This separates the top and bottom substrate portions on either side of the core . . . . In the illustrated example, the top half of the structure is removed for processing separately. The lower half of the structure remains and the back side of this structure is facing toward the top as shown in the drawings. A second plasma mask 636 is then applied over the back side of the structure. This exposes a portion of the pressure sensor for buildup etching 638.

Figure 6O:
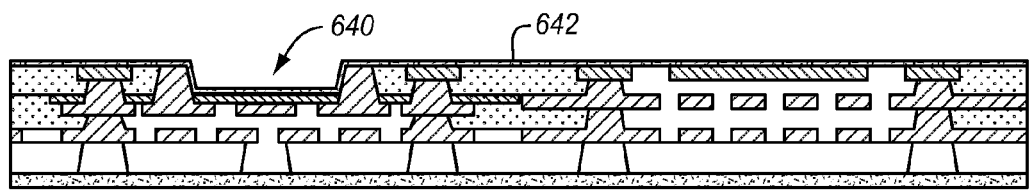
Figure 6P:
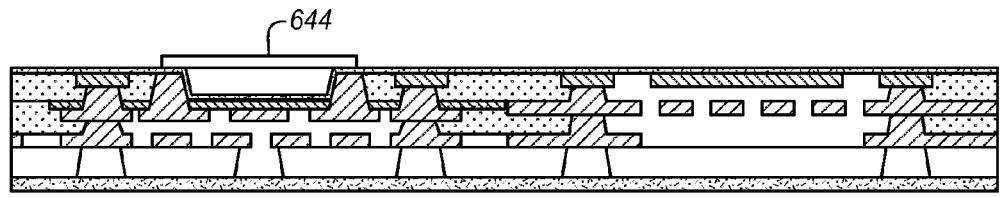
Figure 6Q:
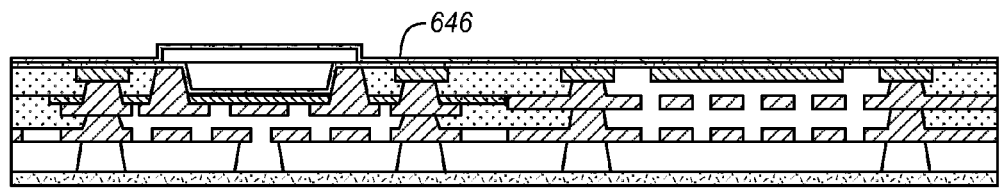

In FIG. 6O the etched out cavity 640 for the pressure sensor is coated in a sealant such as silicon nitride 642. In FIG. 6P the cavity is covered with any suitable material 644 such as solder resist as in the example of FIG. 4M. Alternatively a thin metal sheet can be used to cover the cavity. In FIG. 6Q the solder resist is covered with a silicon nitride coating 646 to seal the cavity.

Figure 6R:
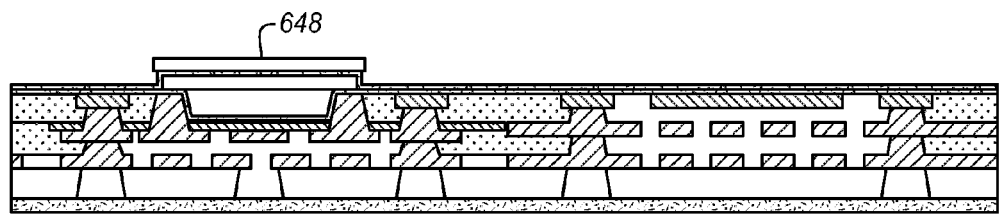
Figure 6S:
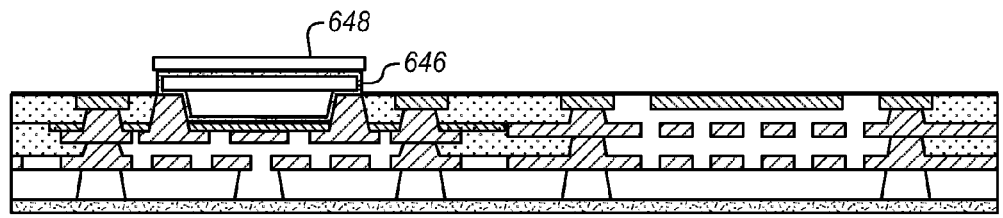
Figure 6T:
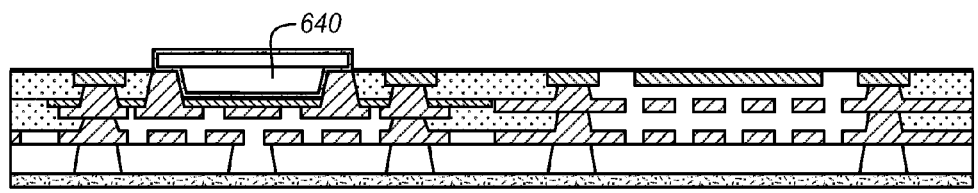

In FIG. 6R a dry photoresist 648 is patterned over the backside of the structure. The dry photoresist protects the pressure sensor cavity but completely exposes the inertial sensor and all other areas on the backside of the structure. In FIG. 6S the silicon nitride layer is etched so that it remains only underneath the dry photoresist 648. In FIG. 6T the DFR film is stripped from over the pressure sensor cavity 640.

Figure 6U:
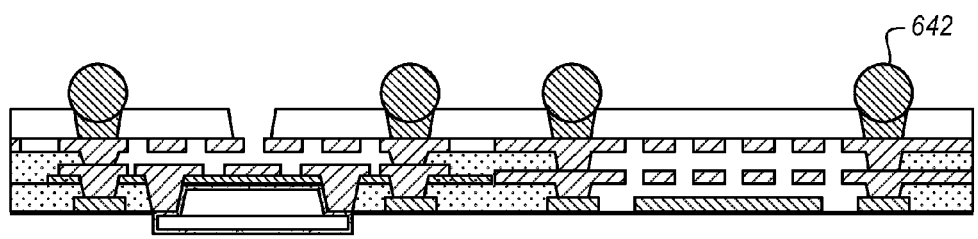
Figure 6V:
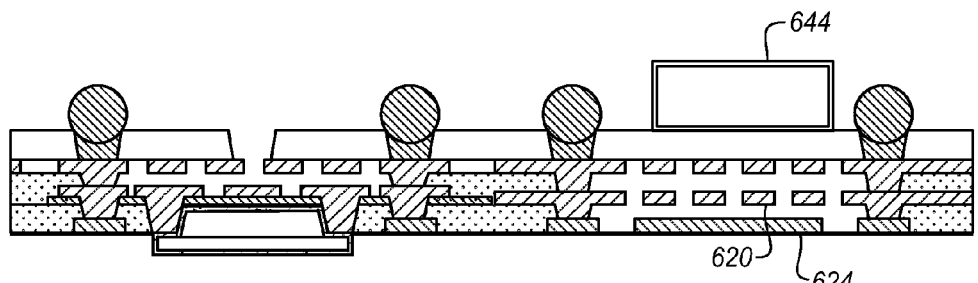

In FIG. 6U a solder ball 642 connection is applied to the front side of the structure after the PET film is removed to connect the pressure sensor and the inertial sensor to the external components. In FIG. 6V a magnet 644 is placed over the inertial sensor area to allow the inertial sensor to detect changes in acceleration or direction as is described above.

Figure 7A:
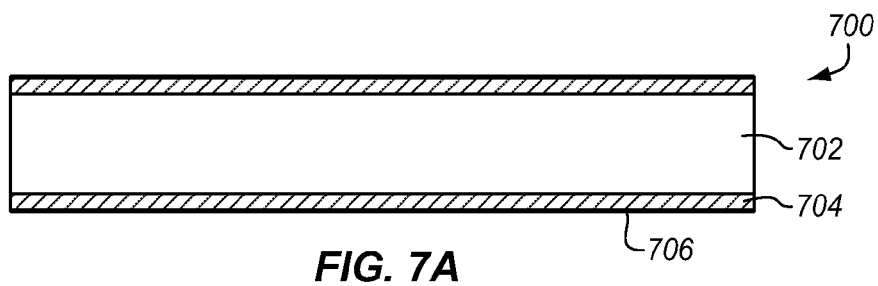
FIGS. 7A-7K illustrate cross-sectional views of various operations in a process flow for fabricating inertial sensors stacked vertically in accordance with an embodiment of the present invention.

FIG. 7A is a cross-sectional side view diagram that shows a process flow for fabricating an inertial sensor in a vertical configuration. In the example of FIG. 7A an incoming peelable core 700 has a carrier 702, a laminated Cu foil 704 and a peelable Cu layer 706. Two inertial sensors may be stacked on top of each other and constructed in a streamlined process as shown herein.

Figure 7B:
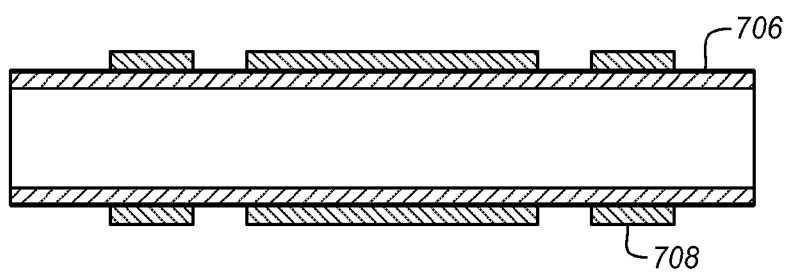
Figure 7C:
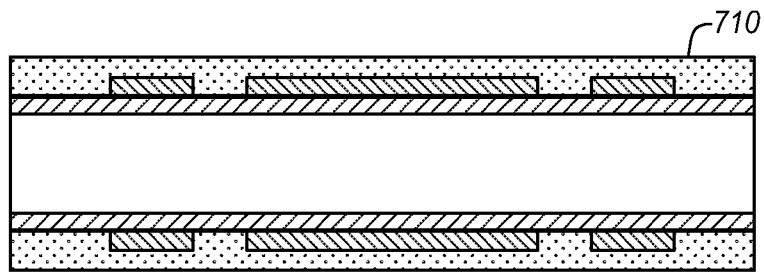
Figure 7D:
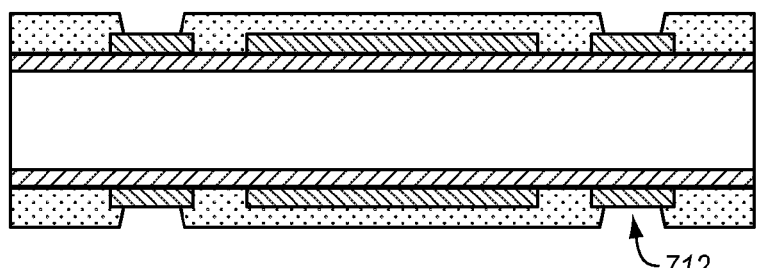
Figure 7E:
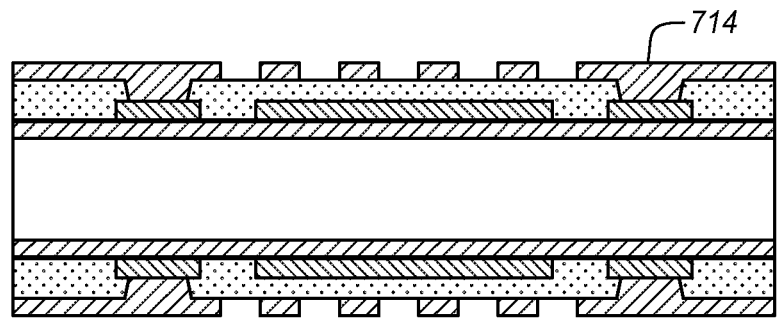

In FIG. 7B a dry film resist is patterned over the peelable Cu layer 706 and used to deposit a copper connection and routing layer 708. The dry film resist is removed revealing the copper patterning. The copper patterning is then covered with a buildup layer 710 to serve as a dielectric and to isolate the copper layers. In FIG. 7D laser etching is used to form valleys 712 through the buildup. In FIG. 7E a second copper pattern 714 is plated over the buildup to form a first copper routing and mesh layer. The mesh layer is formed over the buildup layer which provides a support for the formation of the metal mesh 714.

Figure 7F:
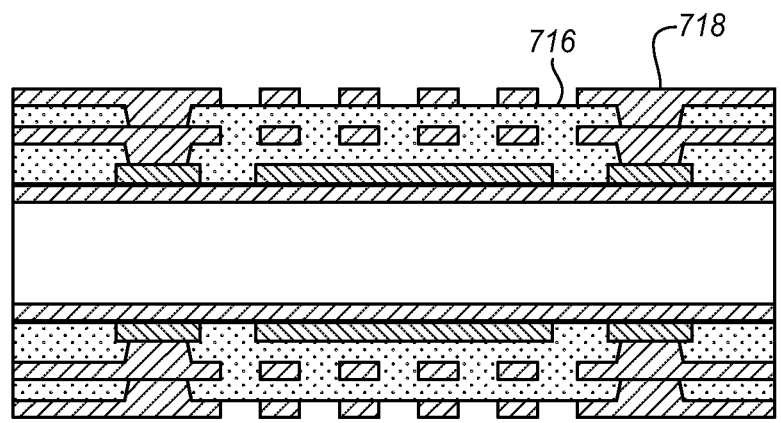
Figure 7G:
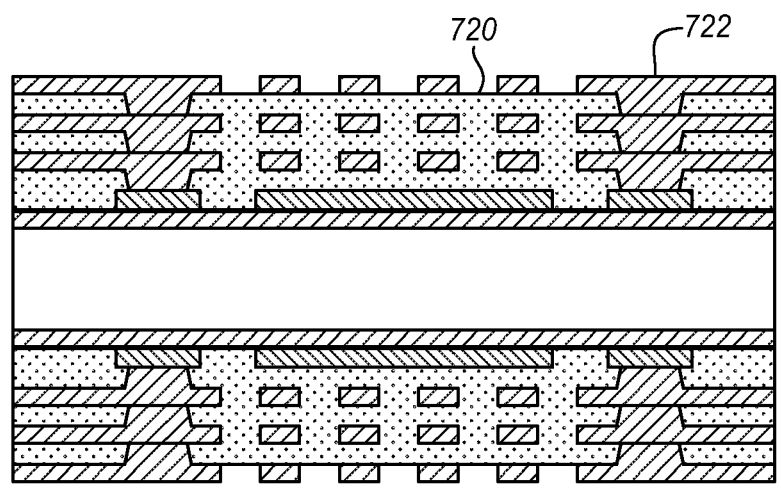

In FIG. 7F an additional buildup layer 716 is formed over the first copper pattern and a second copper mesh layer 718 is formed over the second buildup layer. This provides the two layers of metal mesh that are used in the inertial sensors as described herein. In FIG. 7G a third buildup layer 720 is applied over the second metal mesh layer and a third metal mesh layer 722 is patterned and formed over the third buildup layer.

Figure 7H:
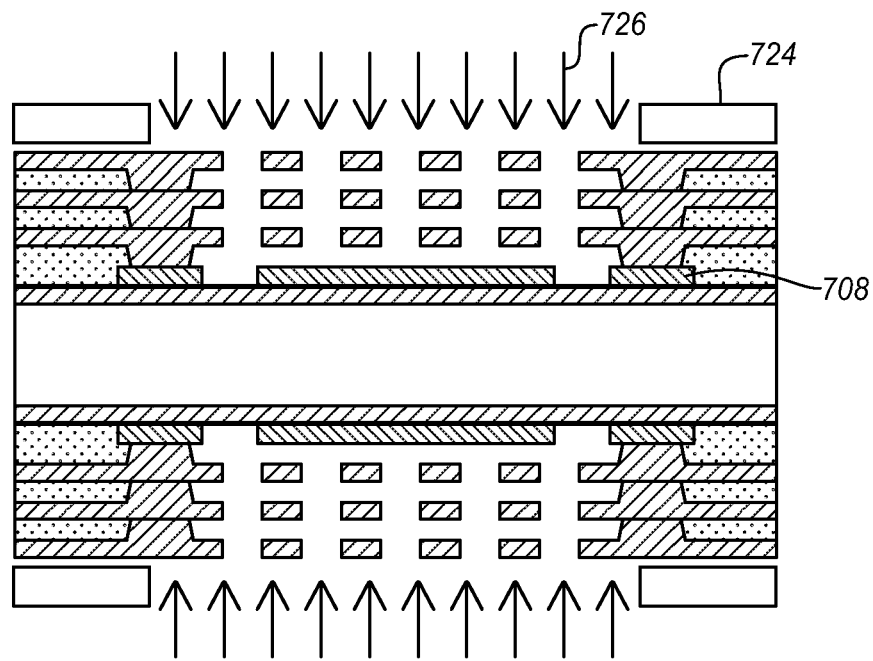

In FIG. 7H a plasma mask 724 is positioned over the entire structure. The plasma mask protects most of the structure while buildup layer etching 726 is applied to remove the buildup layer in the locations where the inertial sensors are to be formed. As shown in FIG. 7H the buildup layer is removed all the way from the third metal mesh layer down to the first metal plating 708 right above the peelable Cu layer 706 in the core.

Figure 7I:
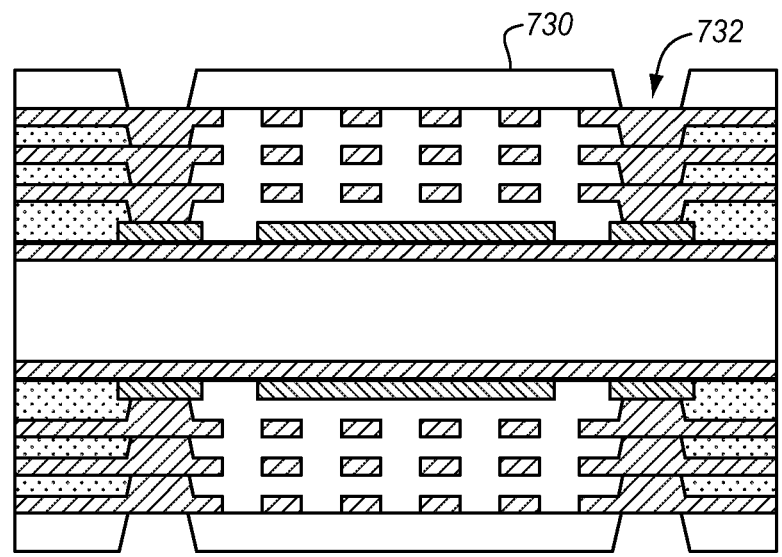

In FIG. 7I a solder resist pattern 730 is formed over the metal mesh layers. The solder resist pattern may be patterned to expose areas 732 for the formation of electrical connections. The exposed areas may take any particular form depending upon the type of connection that is to be used. The solder resist may be covered with a PET film for protection during later processes. The PET film 732 may be removed before the device is completed.

Figure 7J:
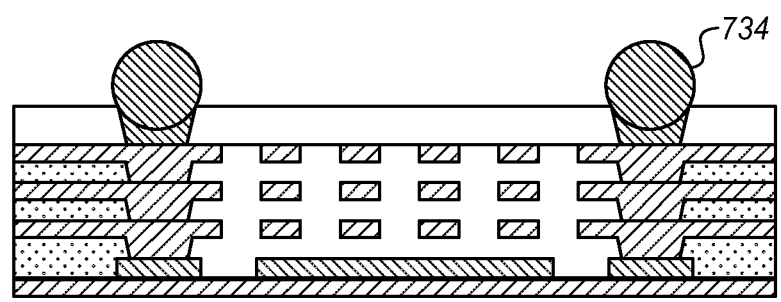
Figure 7K:
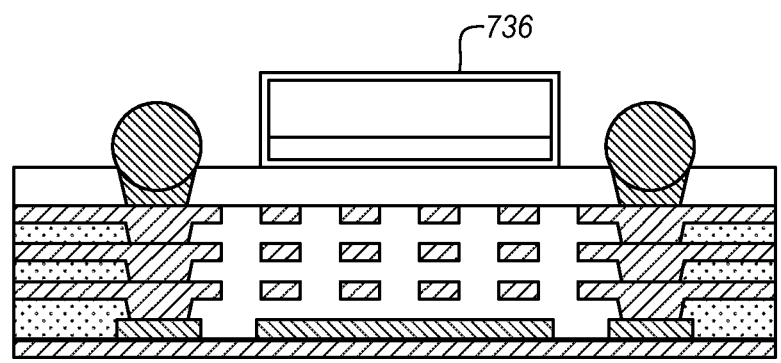

In FIG. 7J the carrier is removed thus separating the top and bottom substrate portions on either side. Only the top portion remains in FIG. 7J, whereas the bottom portion is removed and processed separately. In the remaining top portion, exposed areas 732 are filled with solder or another conductor such as copper. Solder balls 734 are attached at appropriate locations to connect the inertial sensors to external components such as power supplies or signal processing circuits. Finally in FIG. 7K a magnet is placed over the metal mesh layers. The magnet 736 is used to induce a field that operates on the sensor metal structures to produce an electrical signal in response to inertial events.

The packaged semiconductor die may, in an embodiment, be a fully embedded semiconductor die. As used in this disclosure, "fully embedded" means that an active surface and the entire sidewalls of the semiconductor die are in contact with an encapsulating film (such as a dielectric layer) of a substrate, or at least in contact with a material housed within the encapsulating film. Said another way, "fully embedded" means that all exposed regions of an active surface and the exposed portions of the entire sidewalls of the semiconductor die are in contact with the encapsulating film of a substrate. However, in such cases, the semiconductor die is not "surrounded" since the backside of the semiconductor die is not in contact with an encapsulating film of the substrate or with a material housed within the encapsulating film. In a first embodiment, a back surface of the semiconductor die protrudes from the global planarity surface of the die side of a substrate. In a second embodiment, no surface of the semiconductor die protrudes from the global planarity surface of the die side of a substrate.

In contrast to the above definitions of "fully embedded and surrounded" and "fully embedded," a "partially embedded" die is a die having an entire surface, but only a portion of the sidewalls, in contact with an encapsulating film of a substrate (such as a coreless substrate), or at least in contact with a material housed within the encapsulating film. In further contrast, a "non-embedded" die is a die having at most one surface, and no portion of the sidewalls, in contact with an encapsulating film of a substrate (such as a traditional or coreless substrate), or in contact with a material housed within the encapsulating film.

As mentioned briefly above, an array of external conductive contacts may subsequently be formed. In an embodiment, the external conductive contacts couple the formed substrate to a foundation substrate. The external conductive contacts may be used for electrical communication with the foundation substrate. In one embodiment, the array of external conductive contacts is a ball grid array (BGA). In other embodiments, the array of external conductive contacts is an array such as, but not limited to, a land grid array (LGA) or an array of pins (PGA).

Embodiments of the present invention may be suitable for fabricating a system on a chip (SOC), e.g., for a smartphone or a tablet. In an embodiment, an air pressure sensor is integrated and fabricated in a BBUL packaging fab. The same backend processing used for existing traditional or coreless substrate fabrication and packaging may be used as a base flow. Alternatively, the process flow for die integration with MEMS may be applicable to other packaging substrate technologies.

Figure 8:
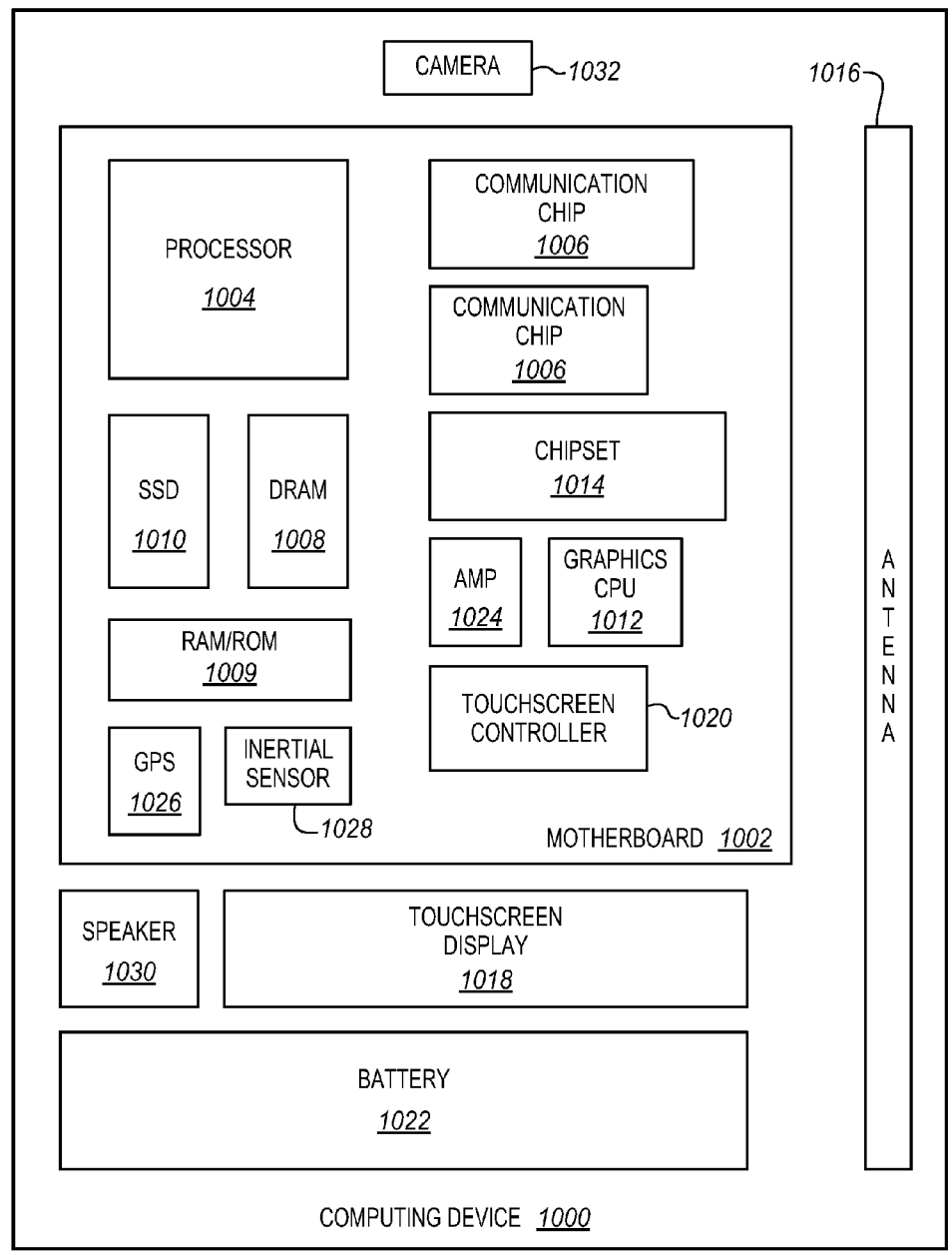
FIG. 8 is a schematic diagram of a computer system, in accordance with an embodiment of the present invention.

FIG. 8 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM) 1008, non-volatile memory (e.g., ROM) 1009, flash memory (not shown), a graphics processor 1012, a digital signal processor (not shown), a crypto processor (not shown), a chipset 1014, an antenna 1016, a display 1018 such as a touchscreen display, a touchscreen controller 1020, a battery 1022, an audio codec (not shown), a video codec (not shown), a power amplifier 1024, a global positioning system (GPS) device 1026, a compass, accelerometer, a gyroscope and other inertial sensors 1028, a speaker 1030, a camera 1032, and a mass storage device (such as hard disk drive, or solid state drive) 1010, compact disk (CD) (not shown), digital versatile disk (DVD) (not shown), and so forth). These components may be connected to the system board 1002, mounted to the system board, or combined with any of the other components.

The communication chip 1006 enables wireless and/or wired communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

In some implementations, any one or more of the inertial sensors 1028 of FIG. 8, may be produced or implemented as described herein. There may be multiple pressure or inertial sensor dies. These dies may include circuitry for other functions shown as discrete dies in FIG. 8. The pressure sensor may be used as a microphone, an altimeter, or barometer, depending on the particular implementation. The term "processor" may refer to any device or portion of a device that processes electronic data from registers and/or memory to transform that electronic data into other electronic data that may be stored in registers and/or memory.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

In the following description and claims, the terms "chip" and "package" are used interchangeably to refer to any type of microelectronic, micromechanical, analog, or hybrid small device that is suitable for use in a computing device.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method. In one example, a diaphragm is formed by depositing a metal over a first dielectric layer. A second dielectric layer is formed over the diaphragm. A metal mesh layer is formed over the second dielectric. The first dielectric layer is etched under the diaphragm to form a cavity. The cavity is lined with a sealing layer. The cavity is covered to form a chamber adjoining the diaphragm, and the cover is sealed against the cavity.

Further embodiments include finishing the substrate with attachment bumps coupled to vias formed in the first dielectric layer and electrically coupled to the diaphragm. Further embodiments include forming metal vias to the diaphragm through the second dielectric layer during forming the metal mesh. In further embodiments forming a metal mesh comprises patterning a photoresist, depositing a metal film and removing the photoresist to form a mesh pattern.

In further embodiments etching the first dielectric layer comprises de-paneling the first dielectric layer from a supporting substrate to expose the first dielectric layer, applying a hard mask over the first dielectric layer and etching the dielectric through the mask. In further embodiments the sealing layer comprises silicon nitride.

Some embodiments pertain to a pressure sensor in an integrated circuit die, the pressure sensor includes a metal sensor diaphragm, a dielectric over the diaphragm, a metal mesh over the dielectric, a cavity under the metal sensor diaphragm, a sealing layer lining the cavity, and a cover over the cavity to form a chamber adjoining the diaphragm so that movement of the sensor diaphragm is sensed by the metal mesh.

Further embodiments include attachment bumps in the die to connect to an external electrical potential, the attachment bumps being connected to the metal mesh through vias in the die. In further embodiments, the metal vias extend through the dielectric.

Some embodiments pertain to a computing system with a processor, a memory to store instructions for execution by the processor, and a pressure sensor. The pressure sensor in the integrated circuit die of the computing system includes a metal sensor diaphragm, a dielectric over the diaphragm, a metal mesh over the dielectric, a cavity under the metal sensor diaphragm, a sealing layer lining the cavity, and a cover over the cavity to form a chamber adjoining the diaphragm so that movement of the sensor diaphragm is sensed by the metal mesh.

Some embodiments pertain to a method of forming a pressure sensor in an integrated circuit die. The method includes forming a releasable layer over a removable core, forming a first dielectric layer over the releasable layer, patterning a metal layer over the first dielectric layer to form conductive metal paths and to form a diaphragm with the deposited metal, forming a second dielectric layer over the metal layer and the diaphragm, forming vias through the second dielectric layer, patterning a second metal layer to connect with the formed vias and to form a metal mesh layer over the diaphragm, releasing the removable core from the first dielectric layer using the releasable layer, etching the first dielectric layer under the diaphragm to form a cavity, lining the first dielectric layer and the cavity with a sealing layer, covering the cavity to form a chamber adjoining the diaphragm, and sealing the cover against the cavity.

Further embodiments include finishing the substrate with attachment bumps coupled to vias formed in the first dielectric layer and electrically coupled to the diaphragm. In further embodiments forming vias further comprises forming metal vias to the diaphragm through the second dielectric layer. In further embodiments patterning the second metal layer comprises patterning a photoresist, depositing a metal film and removing the photoresist to form a mesh pattern. In further embodiments etching the first dielectric layer comprises applying a hard mask over the first dielectric layer and etching the dielectric through the mask. In further embodiments the sealing layer comprises silicon nitride.

Some embodiments pertain to a pressure sensor in an integrated circuit die. The pressure sensor includes a first patterned metal layer to form conductive metal paths of the integrated circuit and to also form a diaphragm of the pressure sensor, a second dielectric layer over the metal layer and the diaphragm, a second metal layer over dielectric layer and the first patterned metal layer to connect with the formed vias and to form a metal mesh layer over the diaphragm, a first dielectric layer under the first metal layer and removed under the diaphragm to form a cavity, a cover under the cavity to form a diaphragm chamber, and vias through the second dielectric layer to connect the metal diaphragm and the metal mesh to external components.

In further embodiments the chamber is sealed with silicon nitride. In further embodiments the metal paths are coupled to other circuitry in the integrated circuit die to relate the diaphragm movement to a pressure.

Some embodiment pertain to a method of forming an inertial sensor in an integrated circuit die that includes forming a releasable layer over a removable core, patterning a first metal layer over the releasable layer, forming a first dielectric layer over the first metal layer, forming a diaphragm coating layer over a portion of the first dielectric layer, forming vias through the second dielectric layer, patterning a metal layer over the dielectric layer to form conductive metal paths and to connect to the diaphragm layer, forming a second dielectric layer over the metal layer and the diaphragm, patterning a second metal layer to form a metal mesh over the diaphragm and coils of an inertial sensor and to connect with the formed vias, releasing the removable core from the first dielectric layer using the releasable layer, etching the first dielectric layer under the diaphragm to form a cavity, lining the first dielectric layer and the cavity with a sealing layer, covering the cavity to form a chamber adjoining the diaphragm, sealing the cover against the cavity, attaching a magnet over the coils of the inertial sensor, and finishing the substrate with attachment bumps coupled to vias formed in the first dielectric layer and electrically coupled to the diaphragm.

In further embodiments forming the diaphragm coating comprises depositing a silicon nitride coating. In further embodiments forming the diaphragm coating comprises patterning the silicon nitride coating using dry photoresist, etching the photoresist, and stripping the dry photoresist. In further embodiments forming vias further comprises forming metal vias to the diaphragm through the second dielectric layer. In further embodiments wherein patterning the second metal layer comprises patterning a photoresist, depositing a metal film and removing the photoresist to form a mesh pattern. In further embodiments etching the first dielectric layer comprises applying a hard mask over the first dielectric layer and etching the dielectric through the mask. In further embodiments the sealing layer comprises silicon nitride.

Some embodiments pertain to an inertial sensor in an integrated circuit die. The sensor includes a first patterned metal diaphragm layer, a first dielectric layer over the first metal layer, a diaphragm coating layer over a portion of the first dielectric layer, a second patterned metal layer over the first dielectric layer to form conductive metal paths and to connect to the diaphragm layer, a second dielectric layer over the second patterned metal layer and the diaphragm, a third patterned metal layer forming a metal mesh over the diaphragm and coils of an inertial sensor and connected with the formed vias, a cavity in the first dielectric layer under the diaphragm forming a cavity, a sealing layer lining the cavity, a cover over the cavity forming a chamber adjoining the diaphragm, and a magnet over the coils of the inertial sensor.

In further embodiments the inertial sensor further comprises a mass near the coils so that movement of the mass affects an alternating current in the coils.

Further embodiments include vias through the second dielectric layer to connect the metal diaphragm layer and the coils of the inertial sensor to other circuitry of the integrated circuit die.

Some embodiments pertain to a computing system that includes a processor, a memory to store instructions for execution by the processor, and an inertial sensor in an integrated circuit die of the computing system. The sensor includes a first patterned metal diaphragm layer, a first dielectric layer over the first metal layer, a diaphragm coating layer over a portion of the first dielectric layer, a second patterned metal layer over the first dielectric layer to form conductive metal paths and to connect to the diaphragm layer, a second dielectric layer over the second patterned metal layer and the diaphragm, a third patterned metal layer forming a metal mesh over the diaphragm and coils of an inertial sensor and connected with the formed vias, a cavity in the first dielectric layer under the diaphragm forming a cavity, a sealing layer lining the cavity, a cover over the cavity forming a chamber adjoining the diaphragm, and a magnet over the coils of the inertial sensor.

Some embodiments pertain to a method of forming an inertial sensor in an integrated circuit die that includes forming a releasable layer over a removable core, patterning a first metal layer over the releasable layer, forming a first dielectric layer over the first metal layer, patterning a second metal over the dielectric layer to form coils of an inertial sensor and to connect to the first metal layer, forming vias through the first dielectric layer, forming a second dielectric layer over the second metal layer, patterning a third metal layer to form further coils of the inertial sensor and to connect with the formed vias, releasing the removable core from the first dielectric layer using the releasable layer, and attaching a magnet over the coils of the inertial sensor.

Further embodiments include finishing the substrate with attachment bumps coupled to vias formed in the first dielectric layer and electrically coupled to the diaphragm.

In further embodiments forming vias further comprises forming metal vias to the coils through the second dielectric layer. In further embodiments patterning the second metal layer comprises patterning a photoresist, depositing a metal film and removing the photoresist to form a mesh pattern. In further embodiments etching the first dielectric layer comprises applying a hard mask over the first dielectric layer and etching the dielectric through the mask. In further embodiments attaching a magnet comprises using a cured die backing film.

Some embodiments pertain to an inertial sensor in an integrated circuit die that includes a first patterned metal layer, a first dielectric layer over the first patterned metal layer, a second patterned metal over the dielectric layer forming coils of an inertial sensor and connected to the first metal layer, a second dielectric layer over the second metal layer, a third patterned metal layer forming further coils of the inertial sensor and connected with a plurality of vias, and a magnet attached over the coils of the inertial sensor.

In further embodiments the second patterned metal layer is further connected to other circuitry of the integrated circuit die. Further embodiments include vias through the first dielectric layer to connect solder bumps of the integrated circuit die to the coils of the second metal layer.

Some embodiments pertain to a computing system that includes a processor, a memory to store instructions for execution by the processor, and an inertial sensor in an integrated circuit die. The inertial sensor includes a first patterned metal layer, a first dielectric layer over the first patterned metal layer, a second patterned metal over the dielectric layer forming coils of an inertial sensor and connected to the first metal layer, a second dielectric layer over the second metal layer, a third patterned metal layer forming further coils of the inertial sensor and connected with a plurality of vias, and a magnet attached over the coils of the inertial sensor.

What is claimed is:

1. A method of forming a pressure sensor in an integrated circuit die, the method comprising:
   forming a releasable layer over a removable core;
   forming a first dielectric layer over the releasable layer;
   patterning a metal layer over the first dielectric layer to form conductive metal paths and to form a diaphragm with the deposited metal;
   forming a second dielectric layer over the metal layer and the diaphragm;
   forming vias through the second dielectric layer;
   patterning a second metal layer to connect with the formed vias and to form a metal mesh layer over the diaphragm;

releasing the removable core from the first dielectric layer using the releasable layer, etching the first dielectric layer under the diaphragm to form a cavity;

lining the first dielectric layer and the cavity with a sealing layer, covering the cavity to form a chamber adjoining the diaphragm; and sealing the cover against the cavity.

2. The method of claim 1, further comprising finishing the substrate with attachment bumps coupled to vias formed in the first dielectric layer and electrically coupled to the diaphragm.

3. The method of claim 1, wherein forming vias further comprises forming metal vias to the diaphragm through the second dielectric layer.

4. The method of claim 1, wherein patterning the second metal layer comprises patterning a photoresist, depositing a metal film and removing the photoresist to form a mesh pattern.

5. The method of claim 1, wherein etching the first dielectric layer comprises applying a hard mask over the first dielectric layer and etching the dielectric through the mask.

6. The method of claim 1, wherein the sealing layer comprises silicon nitride.

7. The method of claim 1, wherein the removable core comprises an inner organic carrier, an outer copper film over the organic carrier, and wherein the releasable layer is formed over the outer copper film.

8. The method of claim 1, further comprising patterning a third metal layer to connect with the formed vias and to form a second metal mesh layer over the diaphragm.

9. The method of claim 1, further comprising forming the first dielectric layer over a peelable substrate and removing the diaphragm and the first dielectric layer from the peelable substrate after forming the metal mesh to expose the first dielectric layer under the diaphragm before etching the first dielectric layer.

10. The method of claim 1, wherein covering the cavity comprises applying solder resist over the sealing layer.

11. The method of claim 1, further comprising forming an inertial sensor over the releasable layer and connecting the inertial sensor to other components of the integrated circuit die.

12. A pressure sensor in an integrated circuit die, the pressure sensor comprising:

a first patterned metal layer to form conductive metal paths of the integrated circuit and to also form a diaphragm of the pressure sensor;

a second dielectric layer over the metal layer and the diaphragm;

a second metal layer over the second dielectric layer and the first patterned metal to form a metal mesh layer over the diaphragm;

a first dielectric layer under the first metal layer and removed under the diaphragm to form a cavity;

a cover under the cavity to form a diaphragm chamber, and vias through the second dielectric layer to connect the metal diaphragm and the metal mesh to external components.

13. The pressure sensor of claim 12, wherein the chamber is sealed with silicon nitride.

14. The pressure sensor of claim 12, wherein the metal paths are coupled to other circuitry in the integrated circuit die to relate the diaphragm movement to a pressure.

15. The pressure sensor of claim 12, wherein the cover comprises solder resist.

16. The pressure sensor of claim 12, further comprising attachment bumps in the die to connect to an external electrical potential, the attachment bumps being connected to the metal mesh through vias in the die.

17. The pressure sensor of claim 12, further comprising a third metal layer to connect with the vias and to form a second metal mesh layer over the diaphragm.

18. A computing system comprising:

a processor, a memory to store instructions for execution by the processor; and a pressure sensor in an integrated circuit die of the computing system, the pressure sensor including a first patterned metal layer to form conductive metal paths of the integrated circuit and to also form a diaphragm of the pressure sensor, a second dielectric layer over the metal layer and the diaphragm, a second metal layer over the second dielectric layer and the first patterned metal layer to form a metal mesh layer over the diaphragm, a first dielectric layer under the first metal layer and removed under the diaphragm to form a cavity, a cover under the cavity to form a diaphragm chamber, and vias through the second dielectric layer to connect the metal diaphragm and the metal mesh to external components.

19. The computing system of claim 18, wherein the chamber is sealed with silicon nitride.

20. The computing system of claim 18, wherein the metal paths are coupled to other circuitry in the integrated circuit die to relate the diaphragm movement to a pressure.

* * * * *